United States Patent
Dickinson et al.

[11] Patent Number: 5,838,568
[45] Date of Patent: Nov. 17, 1998

[54] HEATED CIRCUIT ASSEMBLY TESTER AND METHOD

[75] Inventors: Gerard Truman Dickinson, Owego, N.Y.; James Lee McGinniss, Jr., Friendsville, Pa.; Ronald F. Tokarz, Endwell; Aleksander Zubelewicz, Binghamton, both of N.Y.

[73] Assignee: International Business Machines Corporation, Armonk, N.Y.

[21] Appl. No.: 672,882

[22] Filed: Jun. 28, 1996

[51] Int. Cl.$^6$ .................................................... G06F 19/00
[52] U.S. Cl. .............................. 364/468.28; 364/468.24; 73/814
[58] Field of Search ................ 364/468.24, 468.28, 364/488–490; 29/840; 378/58; 73/571, 575, 578, 848, 810, 853, 854, 814; 324/158.1; 228/103

[56] References Cited

U.S. PATENT DOCUMENTS

| | | | |
|---|---|---|---|
| 3,381,526 | 5/1968 | Rastogi et al. | 73/91 |
| 3,665,751 | 5/1972 | Paine et al. | 73/15.6 |
| 3,910,105 | 10/1975 | Hoffstedt | 73/88 A |
| 4,003,247 | 1/1977 | Moser et al. | 73/99 |
| 4,567,774 | 2/1986 | Manahan et al. | 73/826 |
| 4,696,104 | 9/1987 | Vanzetti et al. | 29/840 |
| 4,777,829 | 10/1988 | Fleischman | 73/810 |
| 4,809,308 | 2/1989 | Adams et al. | 378/58 |
| 4,895,027 | 1/1990 | Manahan, Sr. | 73/799 |
| 4,958,522 | 9/1990 | McKinlay | 73/847 |
| 5,079,955 | 1/1992 | Eberhardt | 73/799 |
| 5,184,517 | 2/1993 | Kelzer | 73/581 |
| 5,447,072 | 9/1995 | Holung | 73/848 |
| 5,471,877 | 12/1995 | Brown | 73/571 |
| 5,567,884 | 10/1996 | Dickinson et al. | 73/814 |

FOREIGN PATENT DOCUMENTS

| | | |
|---|---|---|
| 3245600 | 1/1991 | Japan. |
| 1723679 | 3/1992 | U.S.S.R.. |

*Primary Examiner*—Paul P. Gordon
*Assistant Examiner*—Steven R. Garland
*Attorney, Agent, or Firm*—Pollock, Vande Sande & Priddy

[57] ABSTRACT

An apparatus and method provides a testing process and a machine for implementing a testing process to produce failures on a heated circuit card. The apparatus and method applies a controlled, repeatable shear stress to the joints between a circuit board and its mounted components. The circuit board is heated, and one end is twisted with respect to a second end to produce stresses within the circuit board simulating those imposed on components due to thermal cycling. The apparatus may be computer controlled, for regulating the twisting of the circuit board to produce a precise twist angle during a cyclic twisting of the heated circuit board. Electrical resistance of critical joints may be monitored during the testing, and a data base compiled identifying the cycle count at which a failure occurs and location of the failure on the circuit board.

23 Claims, 33 Drawing Sheets

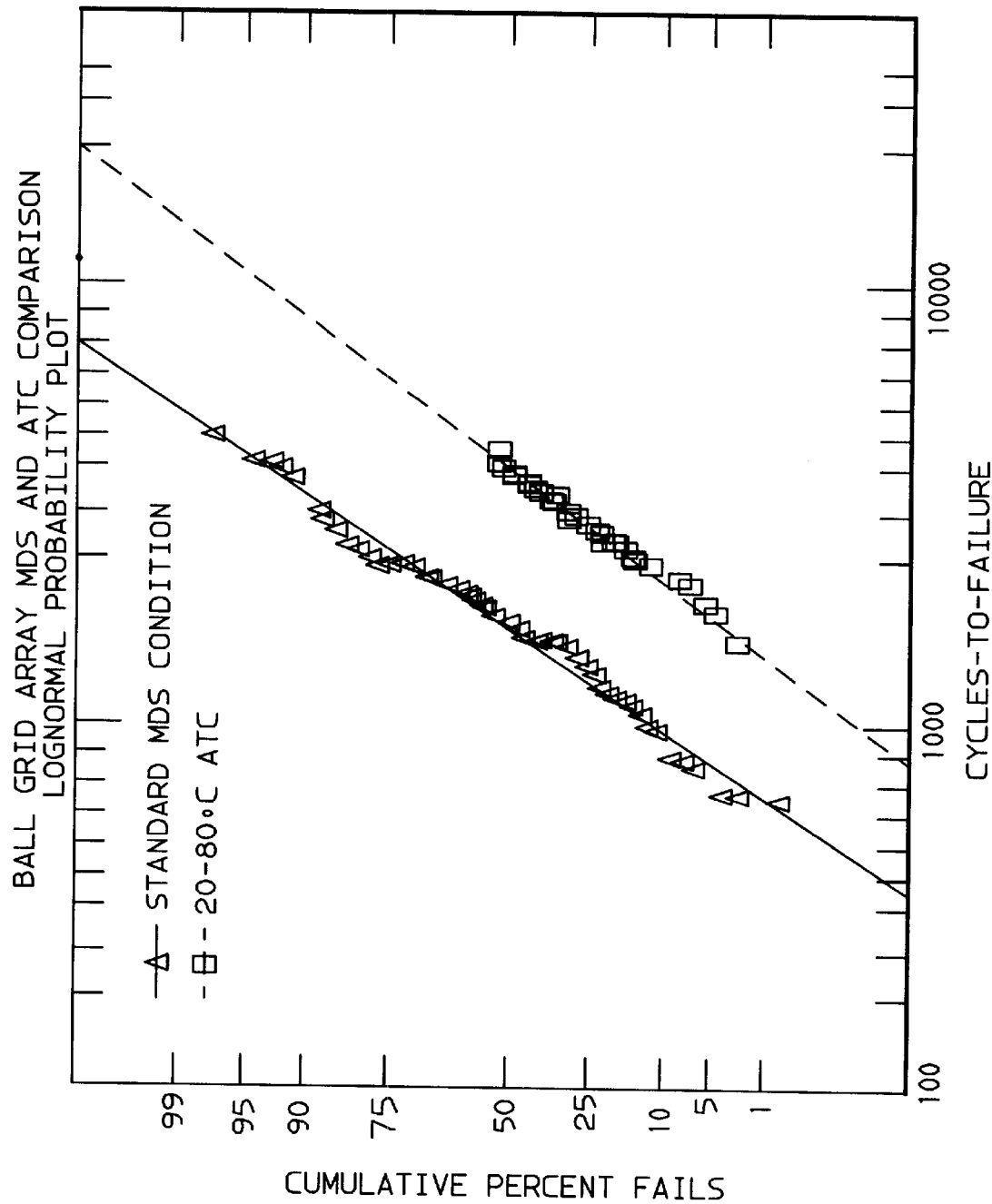

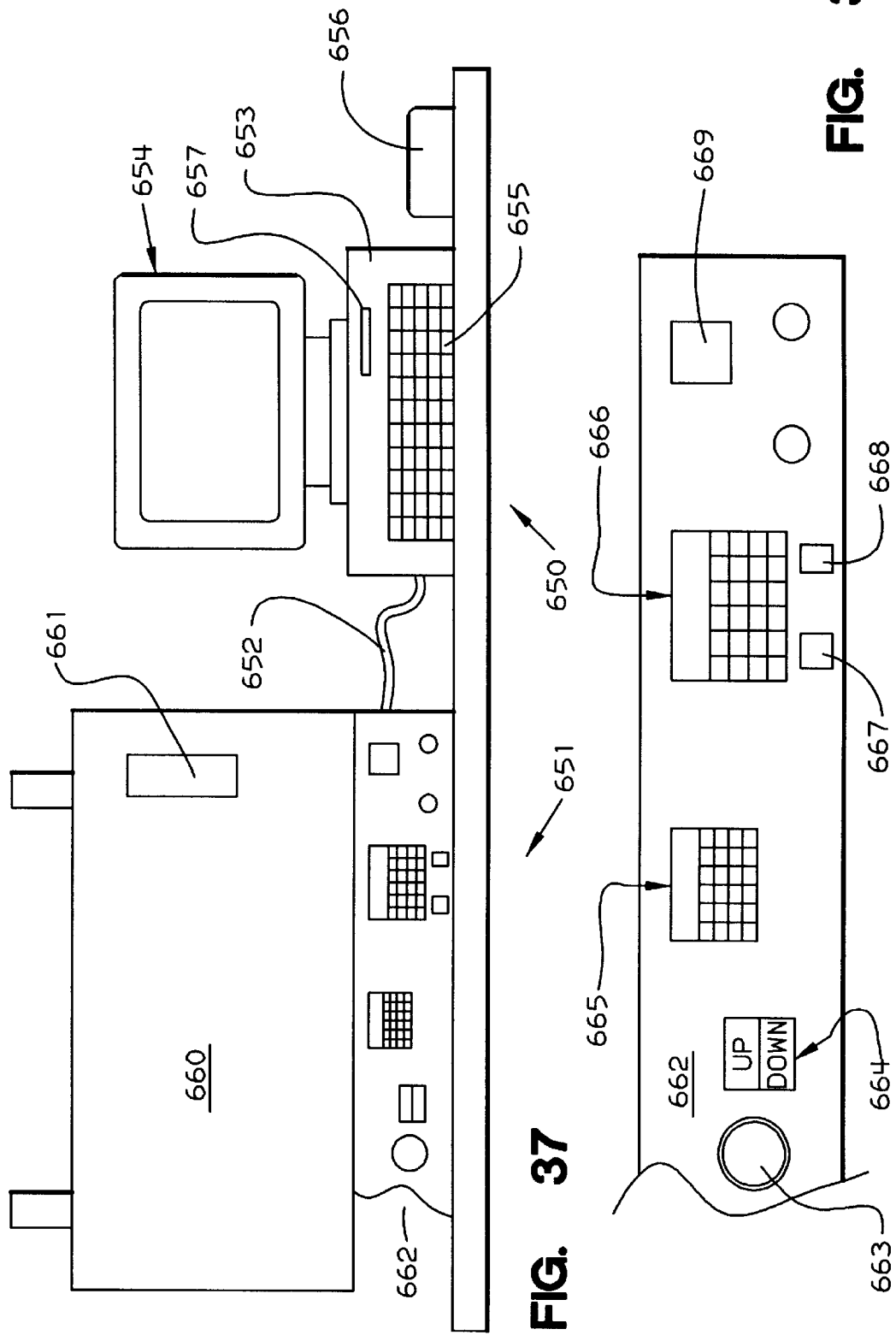

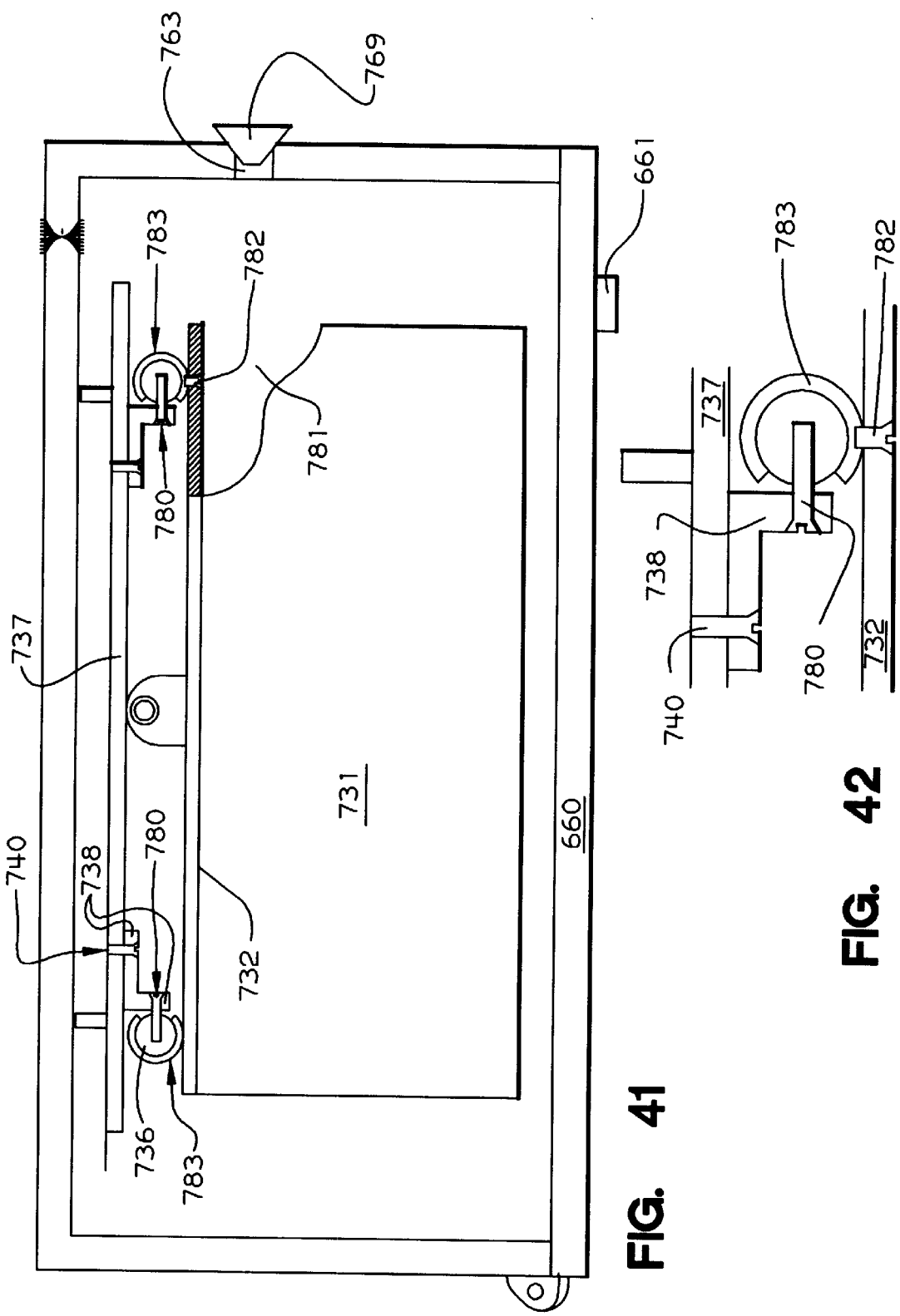

HEATED CIRCUIT ASSEMBLY TESTER AND METHOD

This document is protected by copyright except to the extent required by law to obtain and continue all available patent protection.

FIELD OF INVENTION

These inventions are related to the field of surface mount technology SMT in which components are attached to circuitized substrates to form card assemblies. In SMT assembly, solder paste is screened onto medal pads on card substrate surfaces and leads of surface mount components SMC's are positioned on the pads and the assemblies are reflow heated to form solder joints to provide electrical interconnection structures. Specifically, these inventions are related to methods and apparatus to monitor and optimize existing SMT assembly processes and for design verification and reliability projections in assembly process development. More particularly, these inventions are related to destructive stress testing of SMT interconnect assemblies to predict the reliability of SMT solder joints when exposed to thermal fatigue during operation.

BACKGROUND OF THE FIELD

The following background is for convenience of those skilled in the art and for incorporating the listed citations by reference. The following is not an assertion that a search adequate for examination has been made, or that no other pertinent art exists, or that any of the following citations are material, or that any of the following citations are analogous art, or prior art.

Solder joints are a critical part of surface mount attachment of electronic components. Previously, process quality of SMT circuit card assembly was monitored using periodic visual inspections, pull tests, and accelerated thermal cycling (ATC). Visual inspection of surface mount components SMCs is not sufficient because many defects are not visible. For example, inner joints of ball grid array BGA type SMCs cannot be observed readily. Also, some solder joint defects such as closed cracks, cold joints, and voids cannot be seen.

In pull testing, assembled components are pulled off the circuit card and the appearance of the fractured joints indicates the quality of the assembly process. Again, this method does not reveal all defects because it does not replicate field failure mechanisms; that is, joints do not pull apart in the field, but generally fail from fatigue due to shear stress resulting from different temperatures and/or different coefficients of thermal expansion. During pull testing, joints may pull apart at points far from cracks or voids at which fatigue would cause the joint to fail. Both visual inspection and pull testing require extensive services of a skilled operator for each board assembly tested.

ATC is a good method of finding defects that could cause field failures. Also, ATC testing can be automated so that a skilled operator is only required to electrically test the board after cycling and possibly periodically during cycling. However, ATC is not a practical testing method for monitoring continuous assembly process quality because the total test time is too long. Typically, ATC data is not available until weeks after production, and sometimes tests require months to complete. The cycle time for ATC testing is limited by the heat capacity of the contents of the chambers as well and the heating and cooling capability of the equipment; furthermore, very rapid heating or cooling can substantially affect the results by causing strains between portions with different heat capacities and limiting the creep time at operating temperatures. For interconnect card assemblies, cycle times are typically 20 to 40 minutes.

ATC testing has been used to screen out assemblies subject to early failures during so called burn-in, in which the product is cycled. Some joints which shear due to fatigue remain in compression throughout thermal cycles. If cracks through the joint are under compression during thermal cycling they cannot be detected by functional or continuity testing; these types of failures, however, tend to become evident under field conditions, since the confronting surfaces of the crack will oxidize over time, resulting in field failures. The cycle count of failures during ATC testing is difficult to determine because some failures are difficult to detect during ATC testing. Typically, during product development to prove designs, ATC testing is carried out a predetermined number of cycles and then pull tests are used to find any failures continuity testing would miss.

Those skilled in the field of the invention are directed to the following citations published before the filing date of this application, which may provide guidance in building card twist test machines, processes for testing circuit card assemblies, and processes for analyzing results. Japanese Patent JP 03-245600 and Soviet Union Patent SU 1723679-A1 disclose mechanical testing of joints of circuit card assemblies. In other fields, "U.S. Pat. No. 3,381,526 to Rastogi; U.S. Pat. No. 3,665,751 to Paine; U.S. Pat. No. 3,910,105 to Hoffstedt; U.S. Pat. No. 4,003,247 to Moser U.S. Pat. No. 4,567,774 to Manahan et al."; U.S. Pat. No. 4,777,829 to Fleischman; U.S. Pat. No. 4,895,027 to Manahan; U.S. Pat. No. 4,958,522 McKinlay; U.S. Pat. No. 5,079,955 to Eberhardt; U.S. Pat. No. 5,184,517 to Kelzer disclose test machines, processes or analysis of results.

All the above citations are hereby incorporated in whole by reference.

SUMMARY OF THE INVENTION

The inventors have discovered that out-of-plane twisting of heated circuit cards can produce failures similar to those produced by thermal cycling under field conditions. Using this twisting method of the invention, fatigue life of solder joints in field service can be accurately determined one to two orders of magnitude more quickly than could be done by ATC testing. The invention of Applicants is a system that includes a testing process and a novel machine for using the process. The system can be used to monitor quality of a continuous assembly process, to optimize a continuous assembly process, to verify the design of a new assembly process, to determine the reliability of newly developed assembly processes, or to screen the product for early failures. The system simulates field fatigue conditions in a machine that can perform the test quickly enough for practical application in process control. The system is known as the Mechanical Deflection System (MDS).

The MDS machine includes a twist tester that imposes controlled repeatable shear stress to the joints between the board and it mounted components. To reduce testing time, the circuit cards are heated, increasing the strain on the joints. The resulting stress produced by the machine is similar (but not the same) as that imposed on components due to thermal cycling of the assembly during field use. The fixtures include one rotationally fixed clamp and one rotatable clamp which connected to a backlash free motor and servo system. The clamps hold the boards along most of the clamped edge. The distance between the clamps can be adjusted to fit various board sizes.

The machine also includes a computer, connected to regulate the motor, that has apparatus to control the motor for precisely applying a desired twist angle during the cyclic twisting of the card. The computer includes a CPU communicating with RAM, and an I/O controller connected for communication with peripheral equipment.

The circuit card is also connected to the computer to allow electrical resistance of critical joints to be monitored during testing to determine the occurrence of failures. The computer includes apparatus to determine the cycle count at which each failure occurs and the location of each failure. The computer also includes a database in which the location of the failure and cycle count at which each failure occurs is recorded. The exact angle of twist for each cycle is also recorded in the database so that relative deformation is known.

The test is continued until a large number of failures are produced. The database of the computer also includes failure cycle and location data for a base process. The base process could be another process for making similar boards, or it could be the same process at previous times. The cycle counts and locations of failures of boards produced by a target process are compared to those by the base process. The comparison between the failure locations and cycles at failure is analyzed to statistically determine the reliability of the joints.

The computer is programmable and may be programmed using disk, cartridge or a network connection. The computer is programmed to automatically control the maximum twist angle, to count the cycles, and to receive and record the failure data and number of cycles for each failure.

Other objects, features and advantages of the invention will be apparent from the detailed description of the invention and the following drawings.

BRIEF DESCRIPTION OF THE DRAWINGS

FIG. 4 is a process flow diagram showing a specific embodiment of the process step of torsioning and collecting data of FIG. 1.

FIG. 20 is a plot of the normalized distribution of ATC and MDS testing fails for the BGA assembly process development of FIG. 16.

FIG. 37 illustrates a third embodiment of the MDS tester of the invention on a table.

FIG. 38 shows an enlargement of the operator panel on the covering of the lower section.

FIG. 41 shows a partial section through lines 41—41 of the machine of FIG. 39, in which the top slide assembly is shown.

FIG. 42 illustrates an enlargement of a portion of FIG. 41 including the C-bearing on the slide rod that guides the slide assembly.

FIG. 45 is a process flow diagram illustrating the method of the invention for controlling the cycling.

DETAILED DESCRIPTION OF THE INVENTIONS

The machine and process of the invention replicate ATC failure mechanisms quickly. The machine of the invention imposes cyclic out-of-plane deformation to an assembled printed circuit card. A portion of the deformation is transferred to SMT solder joints in proportion to the stiffness of the board, rigidity of the electronic components, and compliance of leads and the compliance of the solder interconnects. The stress magnitude in solder joints is also a function of the component location on the board, the component type, the position of the joint relative to the component, component to components interactions, and the temperature of the joint. The out-of-plane deformation leads to a complex stress system within each individual joint. The methodology disclosed herein was developed through extensive modeling and testing to properly interpret the quality of interconnect assemblies. This description will enable those skilled in the art to define the proper test parameters to use the process and equipment described for quick and accurate assembly process monitoring, assembly process optimization, assembly process quality verification, determining assembly process reliability, and/or elimination of early failures.

MDS testing can be conducted in a number of different ways, and those skilled in the art may develop their own approach. However, it is preferred that the logical path illustrated in FIG. 1 be maintained.

Figure 1:
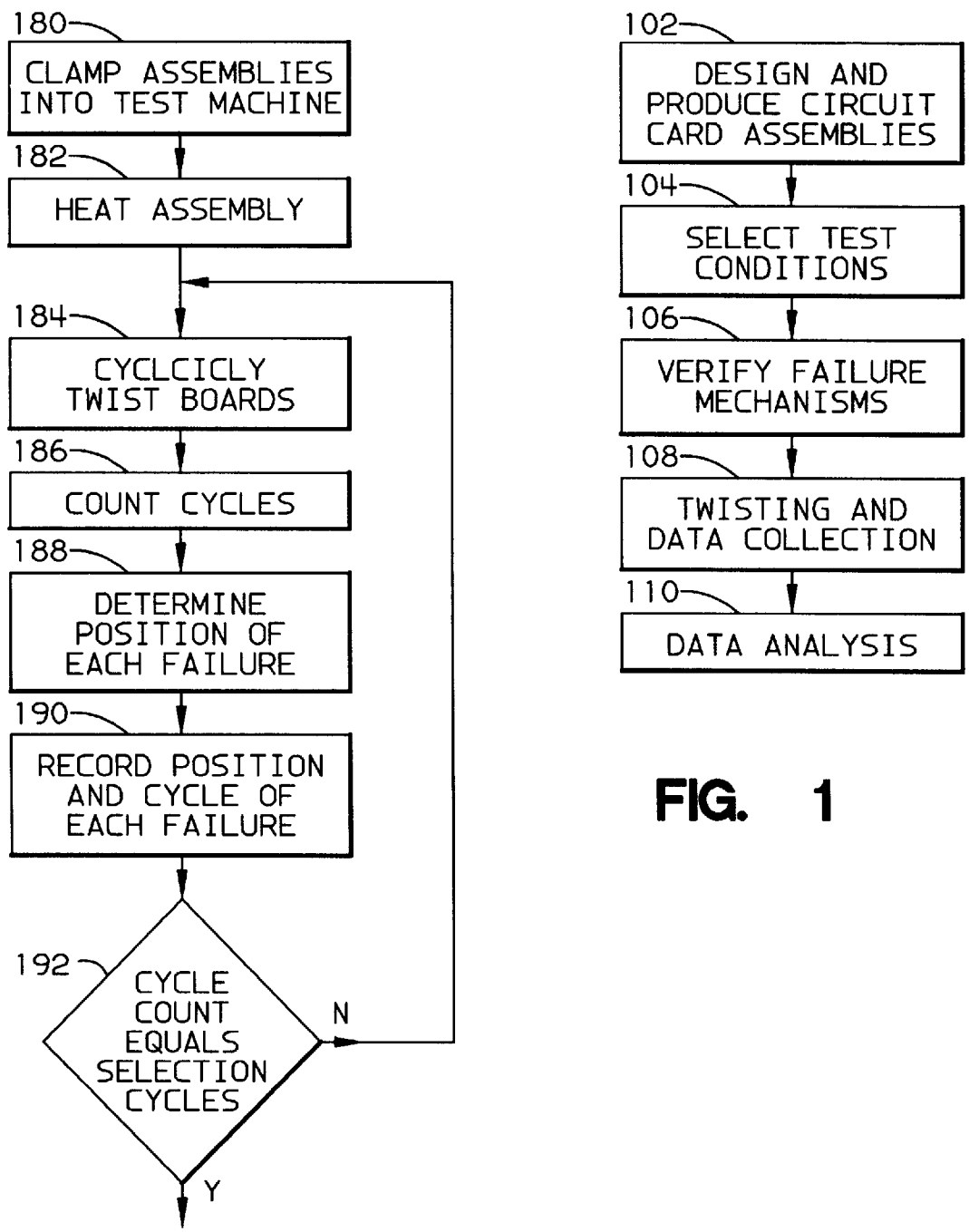
FIG. 1 is a process flow diagram for a specific embodiment of the overall method invention.

In FIG. 1, step 102 the circuit card assemblies used for testing are designed, debugged, and tested. The test of this invention may be carried out using product assemblies selected from those normally produced in the target process; however, custom designed test assemblies, periodically assembled in the same target process as the product assemblies (or prototypes of a process under development), are preferable. The test assemblies would mimic the functional product assemblies but provide for symmetric data and automatic generation of failure data. Alternately, both approaches may be used in combination. For example, special test cards may be used to develop and optimize an assembly process and to produce an experience base, and then actual production cards can be tested and analyzed for continuous process quality control. Also, product assemblies may be designed to provide at least partial automatic failure detection during MDS testing, or functional testing may be performed during MDS testing to detect failures.

Figure 2:
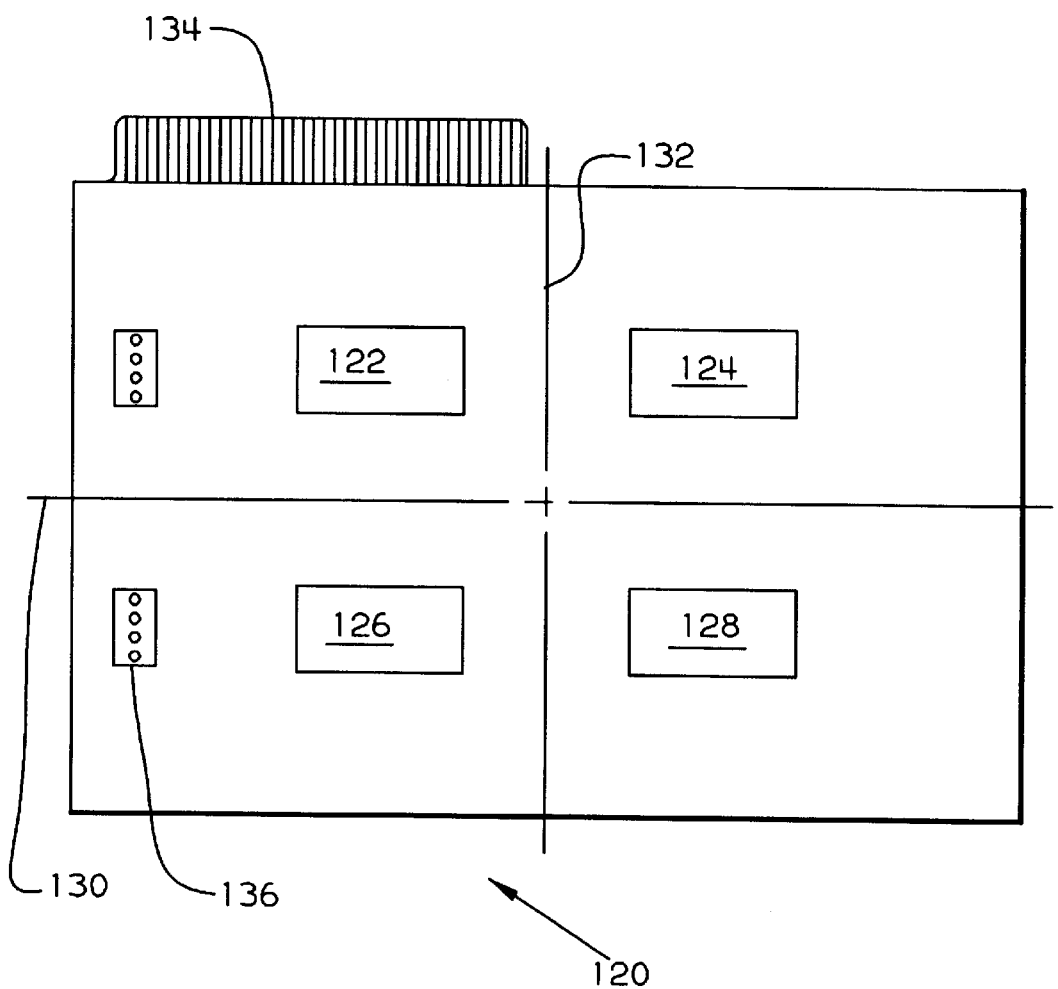
FIG. 2 illustrates an embodiment of the circuit card of the invention showing SMT components mounted symmetrically along the two axes of the board.

FIG. 2 shows a test vehicle for MDS testing. MDS testing applies various degrees of stresses to solder joints, depending on component type, component position on the substrate, component orientation, joint geometry, and joint position on the component. Components near the center of the board tend to experience higher strains. One can reduce these variations by properly selecting the board and component layout, especially in test vehicles. As shown, the preferred ratio of the board width to length is approximately one to two. The shorter ends of the board should be placed in the tester fixture. Complex board geometry might also be considered, but this may require design of special fixtures. Component locations such as 122, 124, 126, and 128 should preferably be symmetrical with respect to longitudinal center axis 130 and lateral axis 132 of the board. Symmetry increases the effective number of data points per board: if four components are placed symmetrically on a board, then each component will experience the same stress in the MDS test, and therefore four equivalent readings will be received from a single board. Using both sides of a board with bi-symmetric component positioning can result in eight equivalent readings. Thus, proper layout of the components can significantly reduce the number of boards that require testing. Components should not be assembled on the board any closer than 0.5 inches from the clamped edges, or custom built fixturing may be required.

Returning to FIG. 1 in steps 104 and 106 test conditions are determined and failure mechanisms are verified respectively. These steps 104, 106 are illustrated in more detail below in relation to FIG. 3. In step 108 during torsioning data is collected. Step 108 is described in more detail below in relation to FIG. 4.

In step 110 the most critical element of the MDS test methodology is the analysis of the joint failure data collected during testing. The data include the position and cycle count for each failure. Also the measured twist angle during each cycle or at least some cycles, may be considered. The analysis of the failure data is described below in more detail in relation to FIG. 5.

Figure 3:
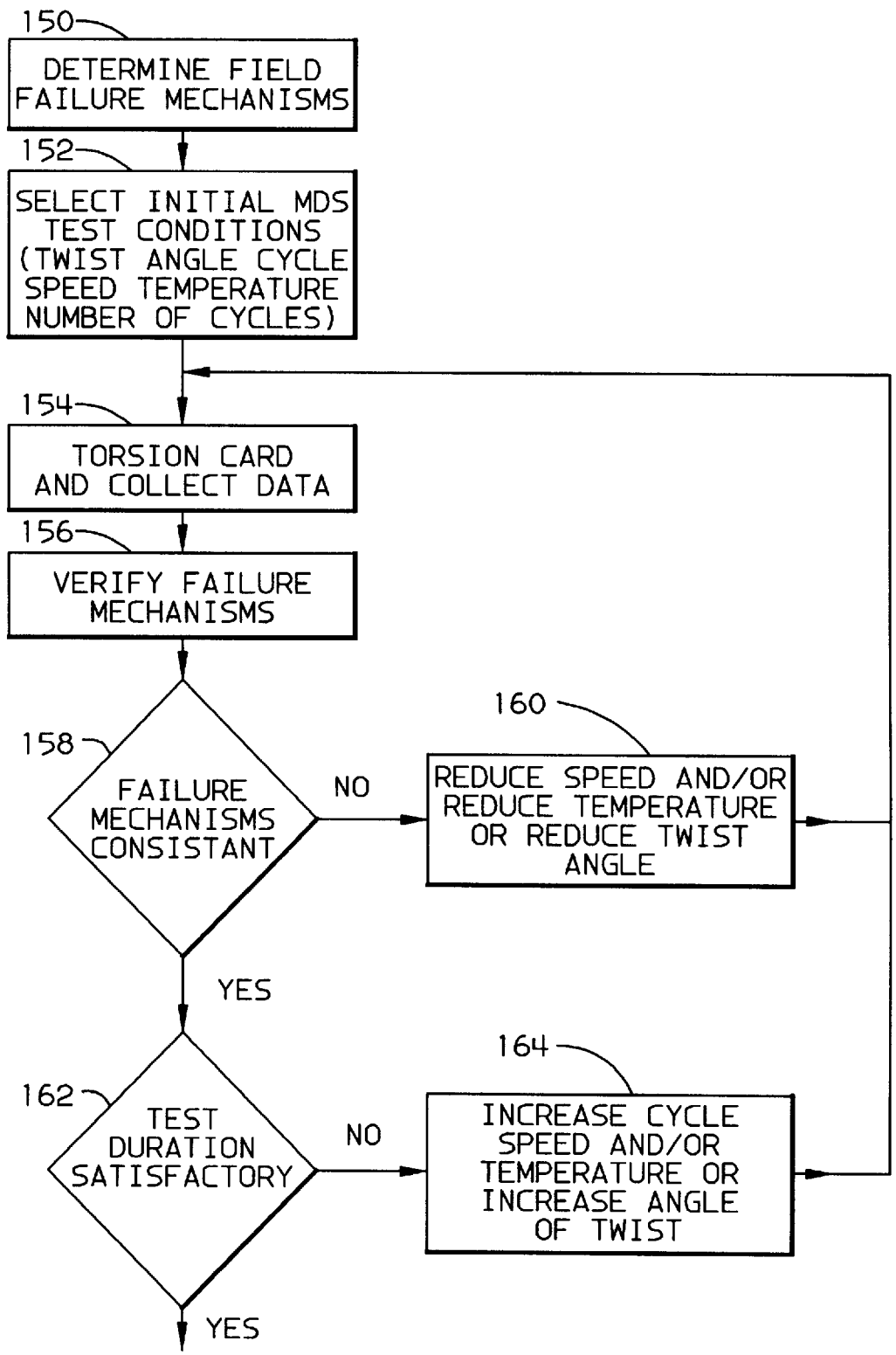
FIG. 3 is a process flow diagram of a specific embodiment of the process steps of selecting test conditions and verifying failure mechanisms of FIG. 1.

In FIG. 3 failure mechanisms are verified and test conditions are determined (see description of steps 104 and 106 above in relation to FIG. 1). In step 150 field failure mechanisms are determined. Experience has shown that ATC testing is an excellent method of simulating field thermal cycling failure mechanisms. Thus, one or more of the assemblies may be subjected to ATC testing to develop a database of failure mechanisms. The ATC testing may be done in parallel to the MDS testing. More preferably, a database of failure mechanisms may be developed from actual field failures of similar interconnect assemblies. Usually the information on failure mechanisms for commonly used technologies is available in industry technical publications. Alternatively, results of testing similar circuit assemblies either ATC or MDS may be used. Preferably, potential failure mechanisms are identified, and understood, before running the MDS test.

In steps 152–164 MDS test conditions are debugged by a trial and error method. In step 152 initial MDS test conditions are selected. Critical test conditions are the angle of twist or the torque, the cycle speed (i.e., cycle frequency), the test temperature (joint temperature), the data acquisition frequency during testing, and the duration of the testing.

When defining MDS test conditions, two factors are important:

Proper failure mechanisms should be achieved in the minimum test time

The amount of data gathered during testing must be sufficient to guarantee adequate assessment of the assembly process.

Solder joints receive stress in proportion to the board deformation, so the angle of twist is the primary variable that controls the stress magnitude. Also, as the circuit card substrate is fatigued during the test the angle of twist may vary in relation to the torque, which would vary the strain on the joints if torque control were used. The angle of twist is preferably selected between 0.4 degrees and 1.2 degrees per inch of effective length. The effective length of the card is the distance between the MDS clamps.

In general, leaded components can be tested at a higher range of deformation (preferably up to 0.9 degrees per inch of length), while leadless components such as BGA, require lower deformation (preferably from 0.4 to 0.6 degrees per inch). Solution of the proper angle of twist is critical. Over-stressed components may exhibit undesired mechanisms of failure, e.g., high lead-tin solders may develop transgranular (instead of commonly observed intergranular) failure, or pads may delaminate, or other undesirable failure mechanisms may occur.

The MDS tester operates at high frequencies (typically as high as 0.5 Hertz) to achieve a high cycle count in a relatively short time. The MDS should be conducted at the highest frequency which will allow for replication of the proper assembly failure mechanisms. Initially, cycle speeds of 6 to 20 seconds per cycle (0.05–0.15 Hz) are suggested, but speed can be adjusted from 2 to 100 seconds per cycle (0.01–0.5 Hz) as desired. Lower frequencies between 20 and 100 seconds per cycle (0.01–0.05 Hz) and dwell time (e.g., 1 second–10 minutes) in a twisted state has proved useful in some technologies where creep is especially important (e.g., eutectic Pb/Sn solder). Higher frequencies (e.g., above 2 Hz) may be useful in some technologies, especially for screening early fails; however, frequencies must generally be kept significantly below modal frequencies of the components and board to avoid unpredictable vibration effects. Again, higher twisting frequencies could lead to undesirable failure mechanisms and therefore must be verified.

Increasing the temperature of the joint increases the joint deformation in relation to twist angle, and provides joint stress fields which are more consistent with those produced during thermal cycling. Also, the fatigue strength of the material is lower at higher temperatures. These two mechanisms combine to produce failures in much fewer cycles at higher test temperatures, and the failures tend to evidence the same failure mechanisms as thermal cycling. Testing temperatures should not normally exceed the glass transition temperature $T_c$ of any organic structural materials in the circuit card, since the card starts becoming much more ductile above that temperature; in some cases, though, higher temperatures may be useful. The testing should be performed significantly below the solidus temperature of the solder joints (e.g., 20° C. below), since yielding results in local heating in the joints, and because minor temperature fluctuations do not seriously affect the results. Typically, for fiberglass-epoxy substrates, $T_c$ is about 125° C. The solidus of eutectic Sn/Pb solder is 180° C., so a test temperature of 125° C. is recommended. Typically, less than half as many cycles are required at 125° C. than at ambient conditions. Initially we suggest that the highest temperature limited by the above considerations be selected, even if it is above operating temperatures, since high temperature is unlikely to result in non-valid failure mechanisms.

The cycle counts at failures per component type and per component location may vary. Some components may fail at very early stages of cycling, while others may experience very long fatigue life. Therefore, MDS test conditions should be optimized in order to provide meaningful information for each assembly processes. Preferably, the mean number of cycles should be given by:

1,000 Cycles<Recommended Mean Life<20,000 Cycles.

The lower cycle limit assures the correct high fatigue mode of metallurgical failure, while the upper one has a strictly practical meaning: MDS test duration should not be longer than necessary.

In some cases MDS can be tuned to obtain reliability data for more than one failure mechanism. For example: for a proprietary BGA assembly process, ATC testing causes only fractures at the top of the ball joint; however, if field failures included cracks at the bottom of the ball joint or separation of the pad from the card substrate, these failures could be replicated and reliability data established by increasing the twisting angle until these other types of failures were predominate.

In the initial test or pre-test it is suggested that the machine be set to a large cycle count. When sufficient failures have accumulated, or if failures occur too low a rate, then the initial test should be terminated and test conditions adjusted.

During testing failure, locations and cycle counts for each failure are determined and recorded. The frequency of data collection itself is one of the test conditions that must be verified. The data collection must be performed at sufficient frequency to provide meaningful statistical data analysis in the process described below in relation to FIG. 5. The cycling may be periodically paused for manual testing of the circuit card assembly and the new failure locations and cycle count recorded at each pause. More preferably, the data is collected automatically during cycling, either periodically (every few cycles) or continuously. Preferably, during periodic data collection, the period between data collection pauses may be varied so that the data may be collected every few failures.

In step 154 data are collected. The collection of data is performed during torsioning, as discussed in detail below in relation to FIG.4. In step 156 failure mechanisms are verified. The failures on the card which was tested are analyzed to determine the failure mechanisms. MDS test results are valid only if the failure mechanisms produced in MDS testing are the same as the failure mechanisms that are produced under the product operating conditions (proper failure mechanisms). Although the MDS test was developed to replicate joint failure mechanisms, MDS twist cycles do not exactly mimic product "duty" cycles; therefore, it is possible that the MDS test may not reflect all the factors needed for proper product evaluation, e.g., local thermal mismatches and creep of organic materials. For these reasons failure mechanisms must be verified for proper use of MDS testing. The MDS fracture mechanisms need verification through construction analysis and/or visual joints assessment. The failures may be compared to ATC testing failures, or, more preferably, the failures are compared to actual field failures.

In step 158, if the failure mechanisms are consistent with field failure mechanisms or ATC test failure mechanisms, then the test conditions are validated. Otherwise, the test conditions are invalid, and in step 160 the twist angle or cycle speed is redefined (usually downward) and the test is run again to attempt validation.

For example, field failure reports or ATC testing of Ball Grid Array (BGA) components mounted on a particular circuit card may indicate that the only expected failure mechanism in operation is separation of the balls from the component pads. However, during MDS setup debugging, substrate pads and lines separate from the card surface. In such a case the angle of twist or the speed of cycling should be redefined (usually reduced) until the correct failure mechanism is obtained. After proper test setup is obtained, such other failure mechanisms may indicate weaknesses of the board design or the assembly process.

If faster testing is desired in step 162 then in step 164, the angle of twist or torque, the cycle speed, or the temperature can be increased and the testing repeated to attempt to validate the higher conditions. In all cases, the MDS test conditions need verification before board testing commences to assure that the proper failure mechanisms are achieved in the minimum time on test.

In order to predict the optimum twist angle, one can use the following equation:

$$\Phi_{desired} = \Phi_{pre\text{-}test} \left[ \frac{N_{desired}}{N_{pre\text{-}test}} \right]^r$$

where the factor r may vary between 0.3 and 0.4. In most cases, one can assume that the factor $r=\frac{1}{3}$. Furthermore, $N_{pre\text{-}test}$ and $N_{desired}$ are the pre-test and desired cycles to failure respectively. Also, $\Phi_{pre\text{-}test}$ and $\Phi_{desired}$ are the appropriate angles of twist applied to the assembled boards.

Typically MDS test conditions are determined using prototype cards. Preferably, the first "main" run, after the MDS test conditions are determined, is used to re-verify the MDS test setup.

In FIG. 4 data is collected by subjecting circuit card assemblies to torsional testing in accordance with the verified test conditions determined above in relation to FIG. 3. In step 180 one or more assemblies are clamped into the test machine of the invention (see FIGS. 21, 32, and 37) for twist testing. Preferably, the clamps extend along the entire edge of the card and the center of twisting is a longitudinal center axis of the card. The testing conditions predetermined in process of FIG. 3 are used for the testing, except that in the data collection step of FIG. 3 the test conditions selected in steps 152, 160 or 164 are used. The assemblies are heated to the predetermined test temperatures in step 181, and torsion cycling with the predetermined twist angle and predetermined cycle frequency is started in step 184. In step 186 twist cycles are counted during testing.

In step 188, the location of each failure is determined. As discussed above, locations can either be determined by pausing the cycling at intervals and manually testing the assemblies, or, during cycling, failures can be automatically determined, either continuously or at predetermined intervals. During pauses in the process, failures may be determined by visual inspection, by X-ray inspection, by vibrating the board or components and measuring acoustic emissions, by rubbing the leads and detecting the resulting strains or, more preferably, by electrical continuity or other electrical testing of the joints (e.g., by analyzing a signal pulse). During cycling, the failures may be detected by electrical continuity, by functional testing during cycling, or, more preferably, by detecting changes in joint resistance (glitches). During bi-directional torsion cycling, any cracks tend to open and shut at some point in the cycling. No failures have been found which were not immediately detectable in every cycle by monitoring for changes in resistance during cycling.

In step 190 failure locations and cycle counts for each of the failures is recorded. Preferably the card communicates with a computer system to automatically determine failure location and automatically record failure data. For example, a cable connected from a computer system of the MDS tester may be connected to the circuit card assembly of FIG. 4. Preferably, any such connectors should be subject to minimum stress during MDS testing. Therefore, it is recommended that the connector, such as card edge 134, be near the narrow edge of the board, which will be inserted in the fixed clamp. More preferably, the connector, such as pin connector 126, is parallel to and along the fixed clamp.

In step 192 the testing is continued until the cycle count (number of cycles counted) equals the termination cycle count (duration) that was predetermined above in reference to FIG. 3. Alternatively, the cycling can be manually terminated, for example, during the initial data collection step of the process of FIG. 3 or if there is some problem with the card assembly or tester.

Figure 5:
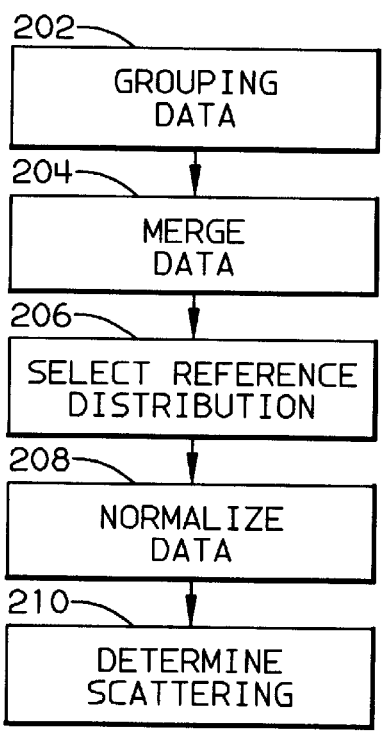
FIG. 5 is a process flow diagram showing a specific embodiment of the statistical data analysis process of the invention.

FIG. 5 shows the steps for performing the statistical data analysis of the invention. In addition to the test conditions, the factors that influence the joint fatigue life during testing are as follows:

technology type, (TSOP, BGA, PLCC, QFP, . . . );
board flexural stiffness;
component and the interconnect compliances;
component location on the tested board;
component orientation;
failure of other joints;
component to components interactions.

Since each of these factors alters the joint fatigue life during MDS testing, a special algorithm is required for data analysis of MDS test results.

In step 202, fatigue data is grouped according to component type, joint location within the tested components, and location of the component on the tested board. The MDS test should provide enough data to build a fails distribution for each selected variable. In step 204 we attempt to merge data. Some distributions can be merged, especially those which belong to the same technology. It is especially convenient if components of the same technology occupy positions which are symmetrical with respect to each central axis of the board (e.g., longitudinal axis 130 and lateral axis 132 in FIG. 2). Since the stress may vary from joint to joint, the fatigue life will vary as well. Distributions of fails are characterized by the mean cyclic life and the scattering of the data. Thus, the individual distributions of fails can be normalized to some reference.

In step 206 a reference distribution is selected for such normalization. Although; there is no special rule for selecting the reference distribution, we prefer to choose a distribution which locates itself in between other distributions. In step 208, the mean lives of the distribution of fails is compared to the selected reference distribution, preferably, the correlation factors are calculated as follows:

$$CF_i \frac{(N_{50})_{reference}}{(N_{50})_i}$$

Each individual cycle count within the i-th distribution is multiplied by the correlation factor $CF_i$. Then, the corrected cycle counts are equivalent to those in the reference distribution. Once all the individual distributions are normalized and merged to the referenced one, all the fatigue data can be used to build the equivalent distribution (scattering) of fails in step 210. The equivalent distribution of fails characterizes the quality of the solder joints under consideration.

MDS testing can be used as a self-learning monitor of assembly process quality. MDS can also be used in combination with ATC testing to assess the reliability of new technologies. The scattering of fails and the mean fatigue life define the quality of an assembly process. The scattering of fails alone might provide a sufficient quality measure for assembly processes monitoring. However, development of new technologies requires an understanding of the mean fatigue life expectancy of the assembly. In such a case, ATC testing can be conducted in parallel with MDS test in order to verify failure mechanisms and establish product reliability.

Figure 6:
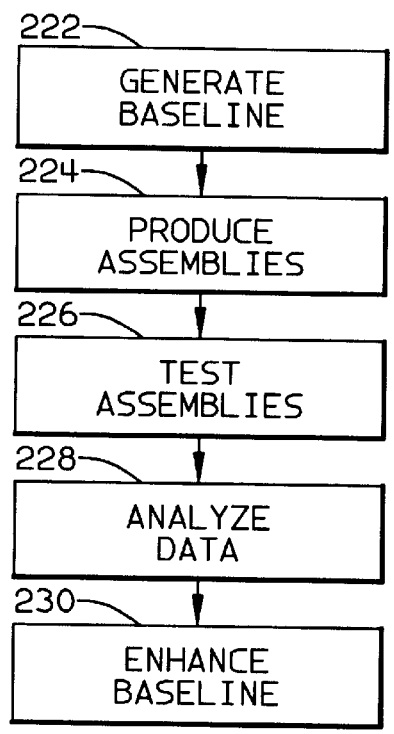
FIG. 6 is a process flow diagram showing a specific embodiment of the process of using the MDS system as a real time monitor and optimization tool for assembly processes.

FIG. 6 illustrates the process of using the MDS system as a method for improved understanding, monitoring, and optimization of assembly processes. In this mode, the MDS system is designed to expose developing defects in the assembly process and allows for very fast corrective actions.

In step 222, a base-line reference distribution is generated from the mean MDS life and the fails scattering (distribution) per component type and per component location resulting from previous MDS tests for the same assembly process. Only statistically valid MDS fatigue data gathered for the assembly process during high quality production is used for the base-line. In step 224, test vehicles must be produced in the assembly line or the functional boards must be selected from those normally produced on the assembly line for testing.

In step 226, the assemblies are tested in accordance with verified test procedures previously discussed in relation to FIG. 3. The testing must be done frequently enough to allow for proper quality control of the line. In step 228, the data is analyzed as described above in reference to FIG. 5. The base-line established in step 222 is used as a reference distribution. Any observed anomalies (e.g., life shorter than expected unexpected failure mechanism, etc.) would indicate the presence of flaws in the assembly process. In some cases, MDS testing was found more sensitive than ATC testing in detecting assembly defects (such as module tilt, misregistration, etc.). Since MDS test duration is measured in hours, this test is considered as a "near" real time monitor of an assembly line.

The MDS monitor is a self-learning method, by which statistical data gathered periodically and over a long period of time can enhance base-line data and allow for better understanding of the process critical variables. In this way, MDS test methodology can optimize assembly processes. In step 230, if there are no anomalies, then the current fails distribution can be combined into the base-line. Alternately if anomalies are identified and process flaws are identified which correlate to the anomalies then the current test can be used to predict specific process flaws from test results. For example, if investigation of an anomalous fails distribution reveals that pads have begun separating from the circuit card during testing, and investigation determines that the cause of pad separation is a contaminated seeding solution, then similar anomalies in fail distributions will immediately indicate that the seeding solution should be checked for contamination.

Figure 7:
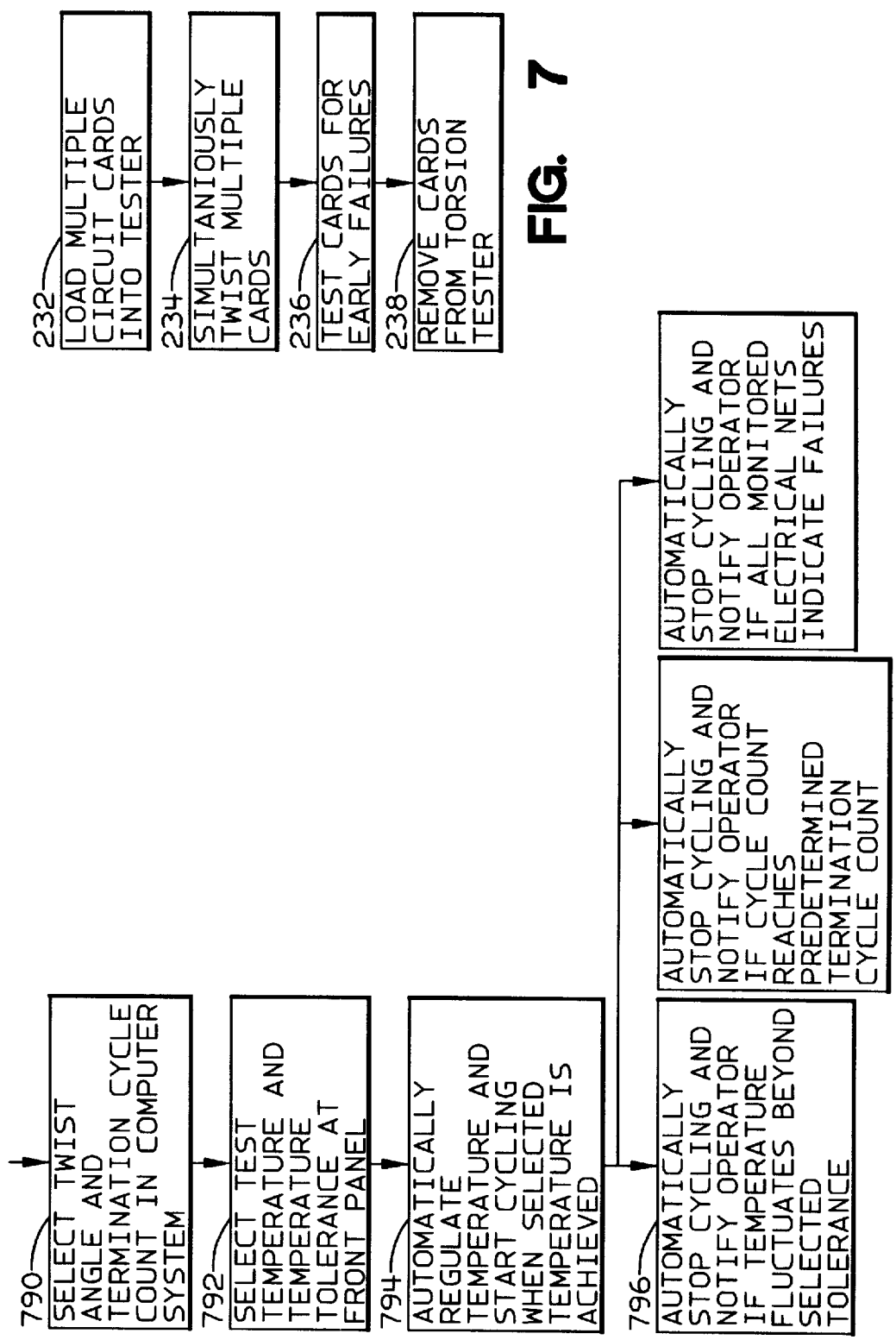
FIG. 7 is a process flow diagram showing the method of screening out early fails of the invention.

MDS testing can be adopted to provide reliability projections for solder joints. The fatigue life received from an MDS test should be compared to fatigue life under ATC test conditions. This can be done by running both MDS and ATC tests in parallel. In FIG. 7, the MDS system is used for screening early failures to eliminate such failures in the product. This is only useful for technologies which exhibit the well known classical bathtub type failure distributions. In step 232, multiple circuit cards are loaded into a twist testing station. In step 234, the multiple cards are simultaneously twisted. Preferably, to reduce testing time and damage to the boards, the number of twist cycles is less than 25. Cycle speed should be selected as high as possible, limited only by the requirement of quickly reducing early failures. Speeds up to 2 cycles per second can be provided by the machine of the third embodiment, but higher speeds may be useful for this task. Twist angle should be selected to provide maximum discrimination between joints that would fail early in the field (defective joints) and those that would not fail early in the field (not defective), and otherwise should provide for the shortest time-on-test practical.

Figure 8:
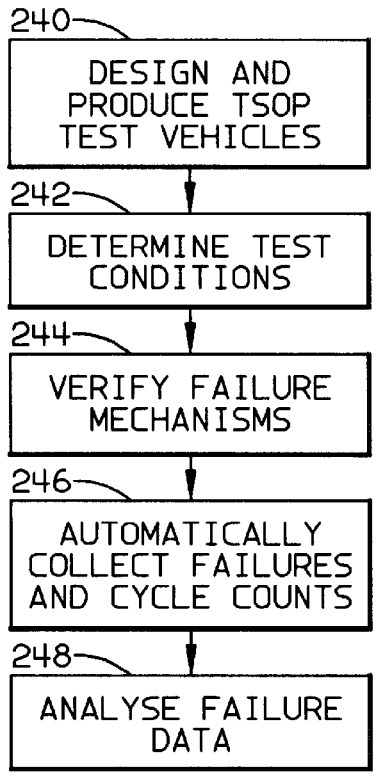
FIG. 8 is a process flow diagram showing a specific embodiment of the process of using the MDS system for design verification and reliability projection for a TSOP assembly process under development.

In step 236 the cards are tested for early failures. In step 238 the multitude of cards is removed from the twist tester. In FIG. 8, the MDS system was used for analyzing the quality of a new TSOP assembly process during process development. The analysis included three parts: quality of the TSOP assembly process for standard components, quality of the rework process for standard components, and quality of the process for lead-on-chip type of components. In this example, the scattering of cycles to failure provides the basis for the analysis.

Figure 9:
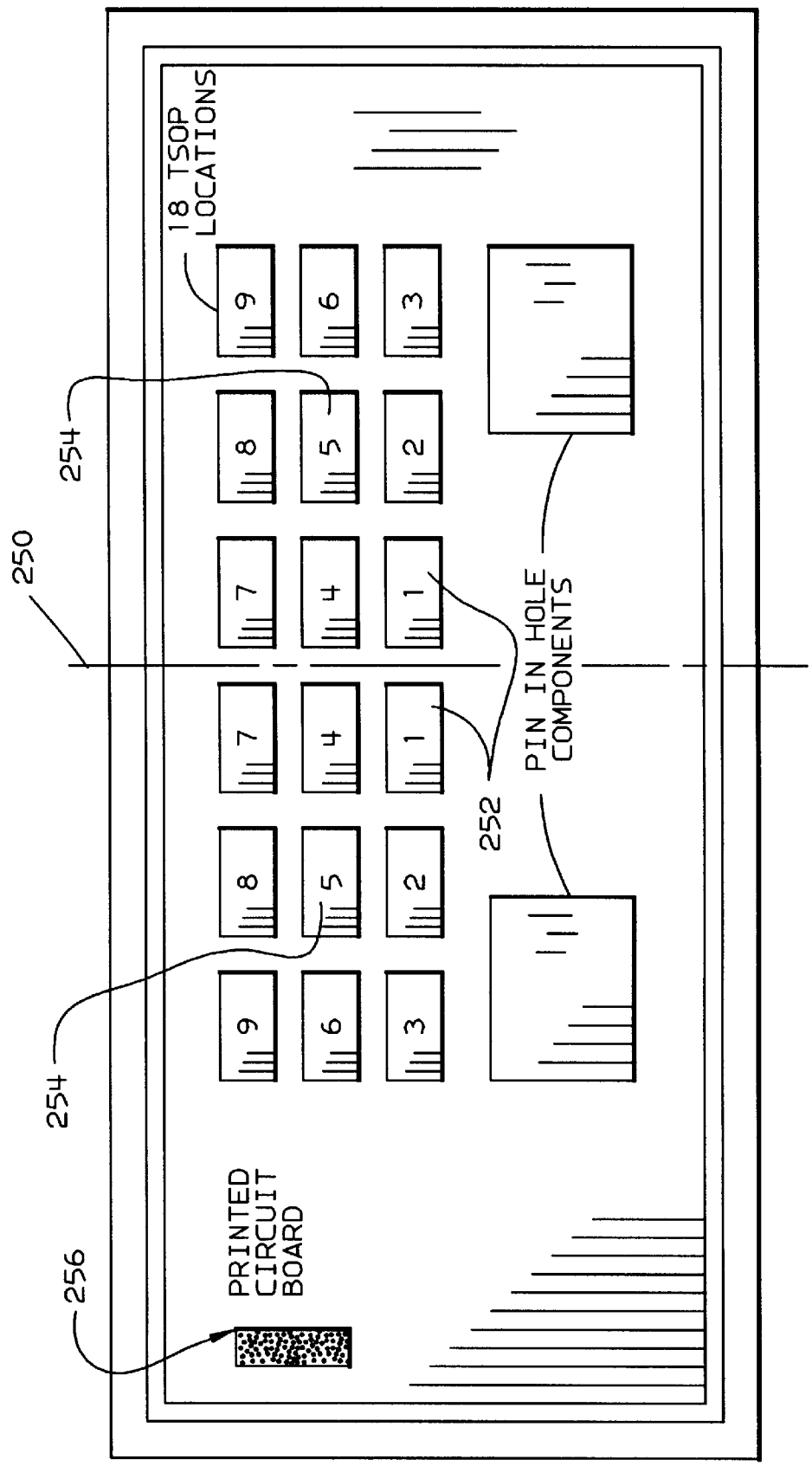
FIG. 9 shows 18 TSOP components assembled to a board symmetrically about one axis in order to produce a specific embodiment of the test circuit assembly of the invention.

In the first step 240 of FIG. 8 a test vehicle (substrate) shown in FIG. 9 was designed and TSOP components were assembled to the test vehicle to form another embodiment of the circuit card assembly of the invention. The vehicle is a double sided board with 18 TSOP components on each side. The components are placed symmetrically on the board with respect to the lateral central axis 250 in FIG. 9. Both sides of the card assembly are identical. As a result, there are four components in every equivalent location. Each component has all the solder joints stitched (serially connected) together to simplify design and production, so that the MDS fails were counted only on a component basis. Eight boards were produced for this test. Boards 1 and 6 have reworked components placed at all of locations 1 (at 252) and locations 5 (at 254). Boards 4, 5, and 6 have assembled lead-on-chip components on the top side at all 18 locations (locations 1–9 on each side of the lateral axis of symmetry). To all the back side locations of all the boards standard TSOP components are attached.

Figure 11:
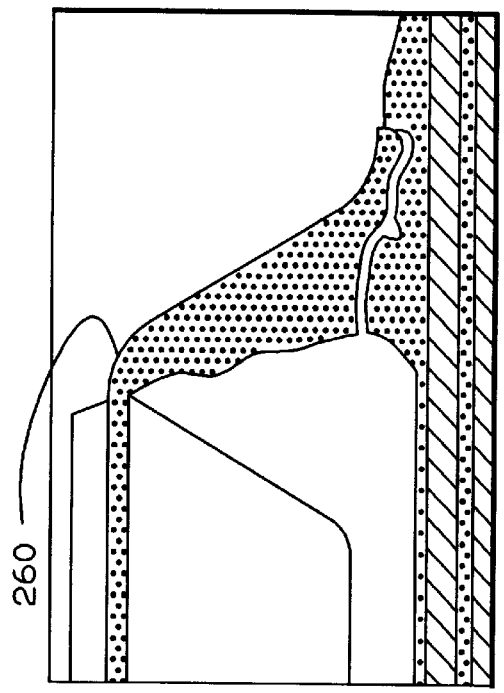
FIG. 11 shows a cracked joint between a card and a lead of a standard TSOPs attached by a propriety process and tested by the MDS process.
Figure 10:
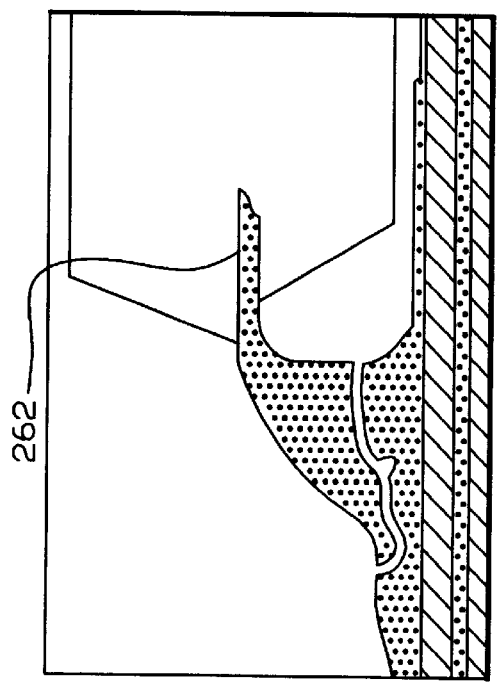
FIG. 10 shows a cracked joint between a card and a lead of lead-on-chip TSOP attached by a propriety process and tested by the MDS process.

As shown in FIGS. 10 and 11, lead 260 of lead-on-chip TSOP is longer and more compliant when compared with lead 262 of standard a TSOP.

In step 242 of FIG. 8, test conditions are determined. A single setup card was used to identify proper test conditions as described above in relation to FIG. 3. The angle of twist was initially set at 0.9 degrees per inch of the card length. The results indicated that the test could be conducted at higher stress levels for reducing excessive cycle count to failure. Therefore, the angle of twist was set at 1.2 degrees per inch of the effective card length. The cycle frequency was 10 sec per cycle and the temperature was ambient. It was determined that the test needed to be run for about 3,600 cycles (about ten hours) to produce sufficient failures for analysis.

Figure 12:
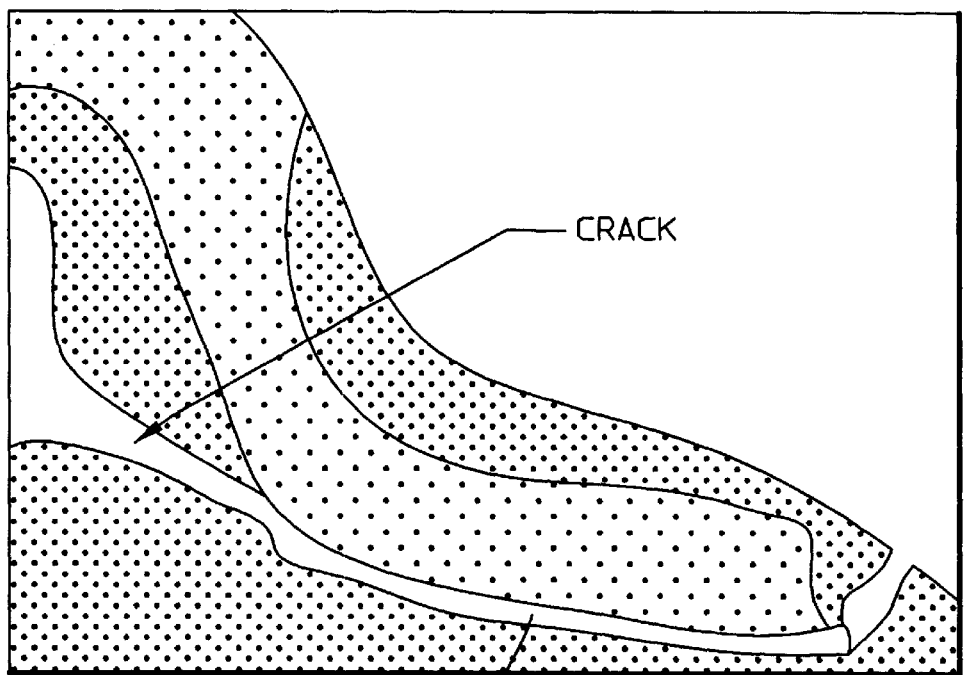
FIG. 12 illustrates an example ATC testing failure of a TSOP joint for comparison to an MDS failure.
Figure 13:
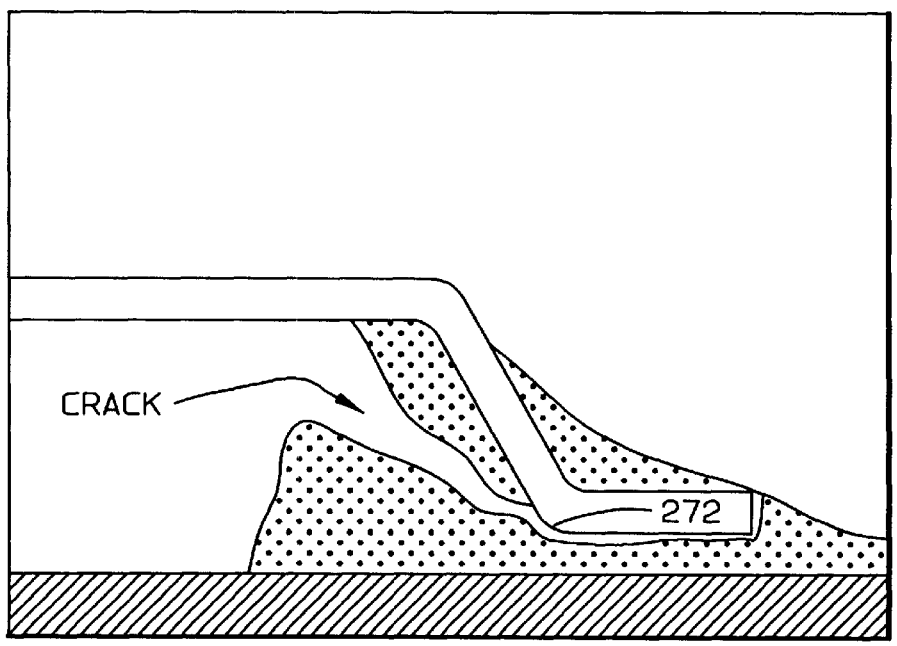
FIG. 13 illustrates an MDS testing failure of a TSOP joint at a similar location to the ATC testing failure of FIG. 11.

In step 244 the failure mechanisms of the test were verified. MDS fracture mechanisms must resemble the mechanisms received from field failures or ATC testing. In this first example, such comparisons were made for TSOP solder joints and it was concluded that the mechanisms are indeed the same. FIG. 12 shows a typical ATC testing failure 270 and FIG. 13 shows MDS testing failure 272 for comparison.

Figure 14:
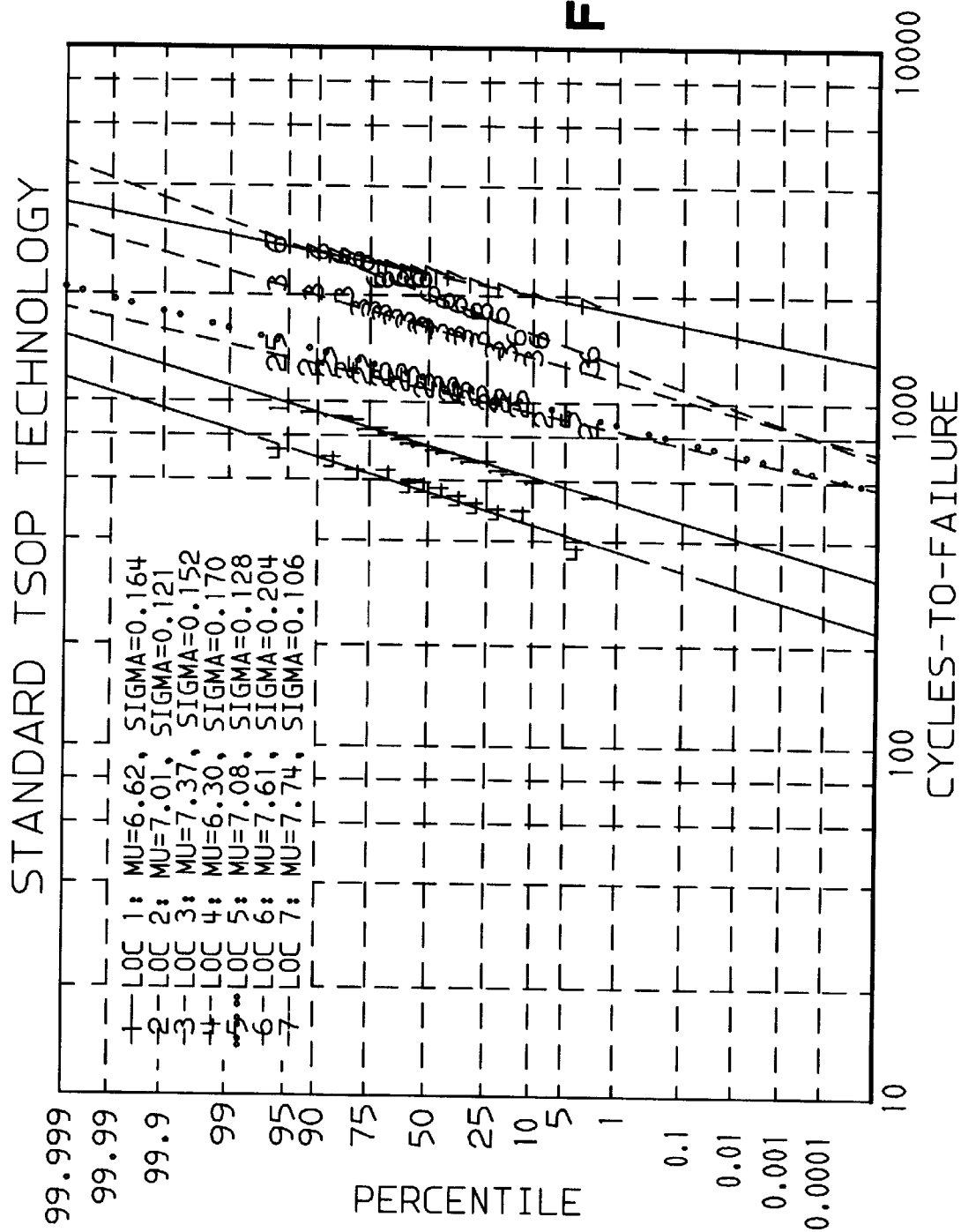
FIG. 14 is a plot of MDS fatigue results in terms of distribution of fails for each location in the example process of FIG. 8.

In step 246 of FIG. 8, data was collected automatically by connecting a cable from the computer system of the MDS tester to pin connector 256 of the circuit assembly of FIG. 9. In this first example, MDS testing commenced and fatigue data were gathered for positions 1–7 (e.g., 28 channels per card were monitored during torsioning). The test was run for 8 card assemblies. In step 248, the failure data were analyzed. FIG. 14 describes the MDS fatigue results in terms of distribution of fails for each location. The number of fails at locations 8 and 9 was insufficient to build a statistically valid distributions of fails. Note that these distributions are very similar. The distributions can be bridged together to a reference location. In this case, location no. 5 (at 254) was chosen for that purpose. Subsequently, mean fatigue lives from locations 1, 2, 3, 4, 6, and 7 were compared to the mean life from location number 5. The correlation factors $CF_1$ through $CF_7$ ($CF_i$ was defined above) were used to re-scale the cycle counts from each location. The resulting total number of data points per location number 5 was:

standard components—112, reworked standard components—12, lead-on-chip components—30.

Figure 15:
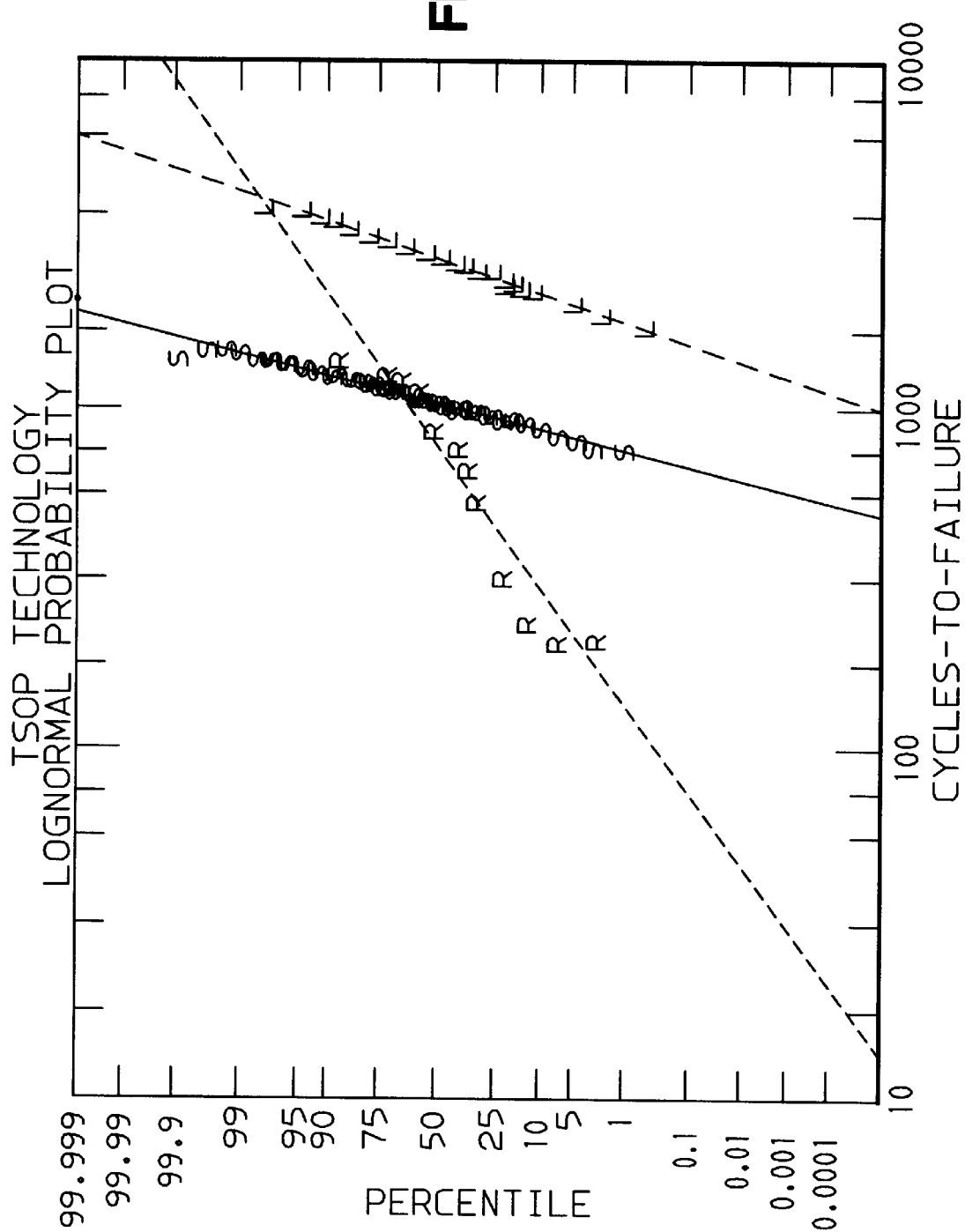
FIG. 15 is a plot of the final distribution of failures in the example process of FIG. 8.

The final distributions of fails are presented on FIG. 15, and the conclusions from the test are summarized in Table 1.

Figure 16:
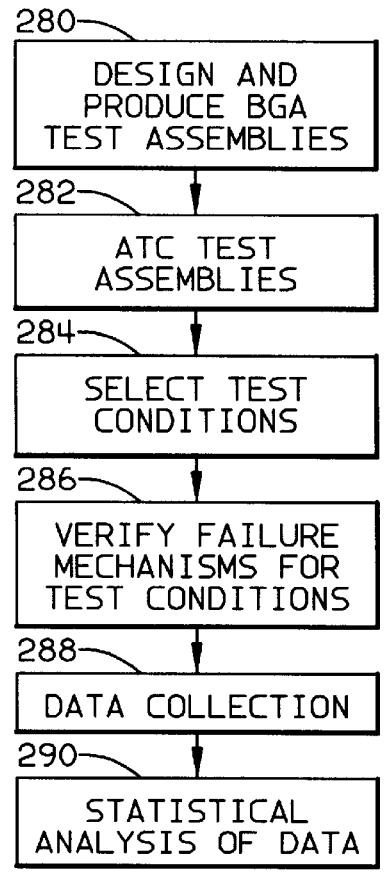
FIG. 16 is a process flow diagram showing a specific embodiment of the process of using the MDS system for design verification and reliability projection for a BGA assembly process under development.
Figure 17:
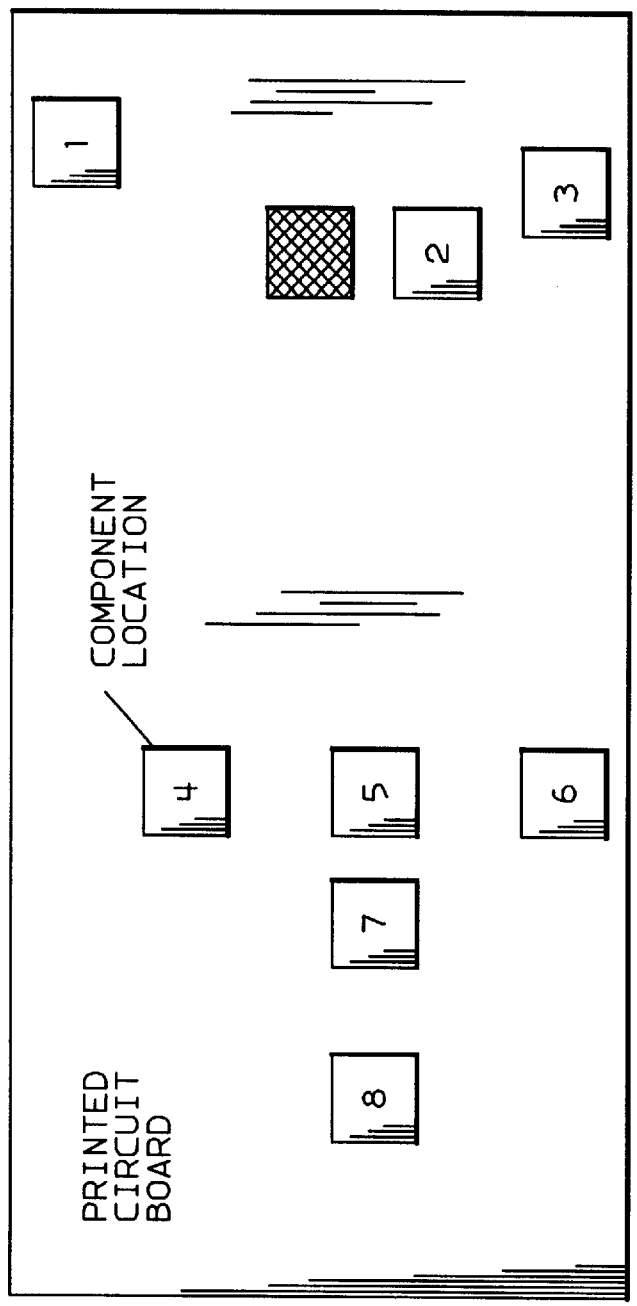
FIG. 17 illustrates BGA components assembled to a non-symmetrical test vehicle used in an example embodiment of the MDS process of FIG. 16.

In FIG. 16 a second example of using the MDS system for process development is illustrated. The MDS test method was used to analyze the reliability of a new process to attach chip carrier modules (components) to circuit card substrates (test vehicles) using an area array of solder balls herein called Ball Grid Array (BGA). In step 280 eight BGA components were assembled to a test vehicle, as shown in FIG. 17. Again for each component the joints were stitched together to provide failure data only on a component basis. Electrical readings were recorded for each component. There is no symmetry in locations of the components, so that the count of cycles to failure varied from component to component.

In step 282 ATC testing was performed to develop a basis for failure mechanism verification. Normally only one ATC test should be required, but, in order to verify the MDS test method statistically, fifteen boards were cycled between the temperatures of 20° and 80° Celsius with a frequency of $8.3 \times 10^{-4}$ Hz (20 minutes per cycle) for a sufficient time to generate multiple failures (about 50% of components) on the boards (about 4,500 cycles). For ATC, time on test to 50% failure was 63 days.

In step 284 test conditions were determined. MDS tests were run on three other boards using 0.45, 0.6 and 0.9 degrees per inch of the board length and 0.1 HZ frequency (10 sec per cycle). The test was performed at ambient temperatures and continued for 5,800 cycles. For MDS, time on test to about 97% failure was 16 hours.

Figure 19:
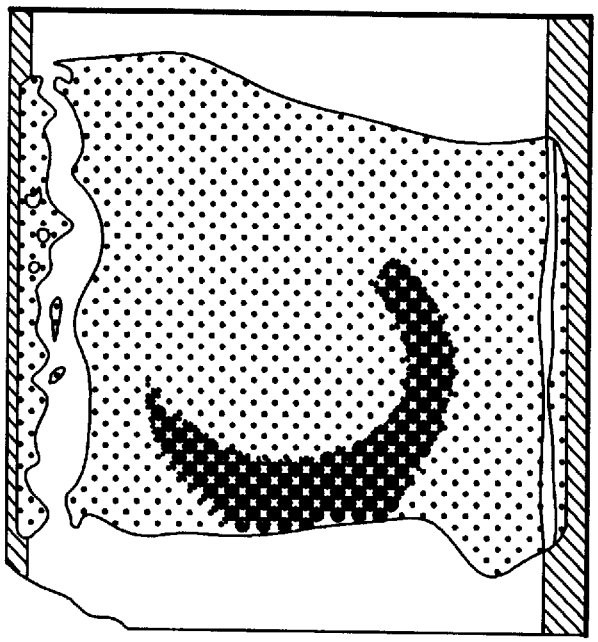
FIG. 19 illustrates an example joint failure produced by MDS testing at a location corresponding to that in FIG. 18, showing a similar failure mechanism.
Figure 18:
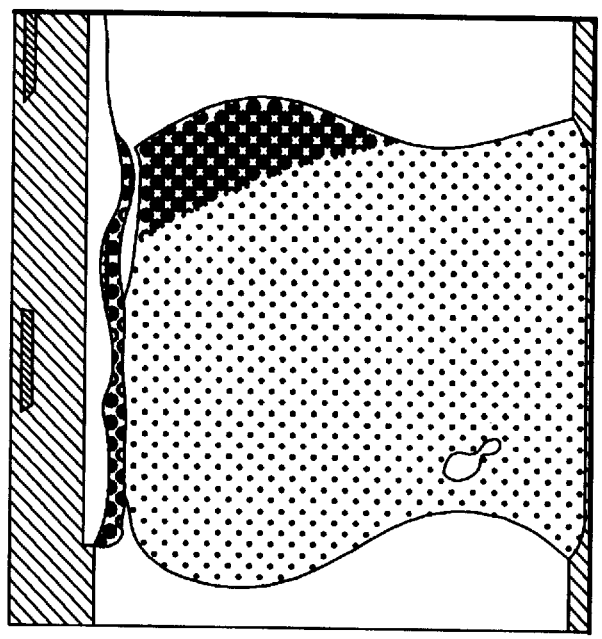
FIG. 18 shows an example joint failure produced by ATC testing of the BGA component assembly of FIG. 17.

In step 286 test results were verified with regard to failure mechanisms. Comparison of ATC testing as shown in FIG. 18 with MDS failures at 0.6 degrees per inch as shown in FIG. 19, shows that failure mechanisms are similar. The MDS test at 0.45 degrees per inch was similarly validated. However MDS testing at 0.9 degrees per inch occasionally caused partial separation of copper pads from tested boards, which is not a valid mechanism since the ATC tested boards did not fail by that mechanism.

The first test runs indicated that both 0.6 and 0.45 degrees per inch were satisfactory in terms of failure mechanisms. However, about twice as many cycles were required to produce the same level of failures when testing at 0.45 degrees per inch than at 0.6 degrees per inch. Thus, 0.6 degrees per inch of board length was selected for further tests.

In step 288 data were collected for an additional 12 cards using the verified predetermined test procedure (0.6 degrees per inch, frequency of 0.1 Hz (10 sec per cycle), ambient temperature, continuous data collection, 5,800 cycles) and then failure data (the cycle of each failure and location of each failure) was collected. Failure mechanisms were similar to those of ATC testing.

In step 290 statistical data analysis of data is performed. The normalized distributions of fails were plotted for MDS and ATC test conditions in FIG. 15. The individual distributions of fails were normalized using Finite Element Analysis and predictive fatigue models. In this case, the normalized MDS and ATC plots look almost identical. The only difference is in the test duration. The ATC test would require more than half a year to achieve the complete failure distribution achieved by the MDS system in only 16 hours.

The MDS testing methodology requires highly accurate repeatable test parameters. The novel combination of features provided in the MDS twist test machine provides the accuracy and repeatability required and automatic features for convenience and to prevent errors during testing.

Figure 21:
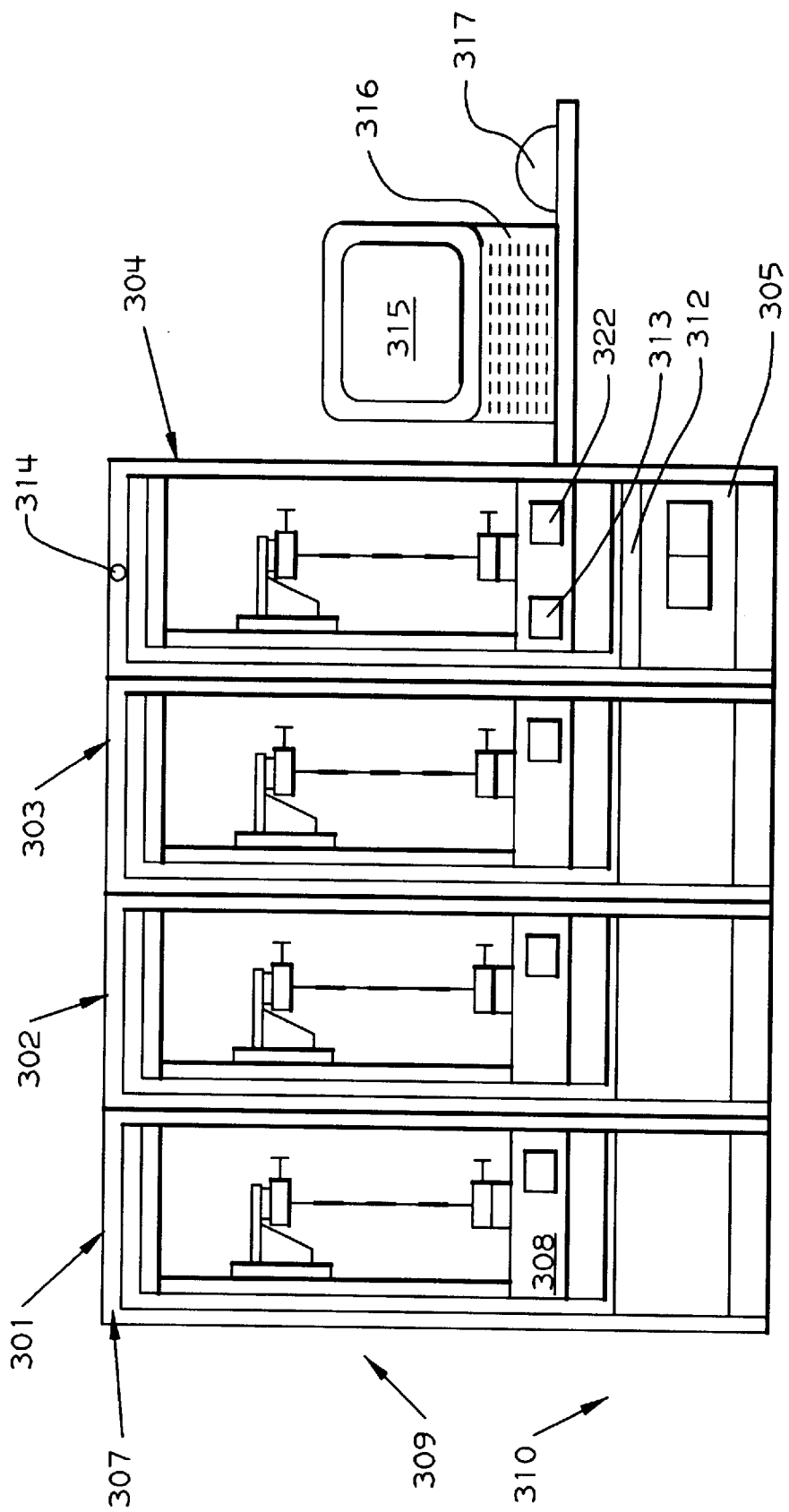
FIG. 21 shows an embodiment of the MDS tester of the invention, including an operator interface, a main test station, and three typical test stations.

A specific embodiment of the MDS machine is shown schematically in FIG. 21. In this embodiment the MDS machine is an assembly of 1 to 4 twist testing stations 301–304 interconnected with a computer 305 such as an IBM PS/2™ 7537(PS/2 is a trademark of IBM). The test stations each include an industry standard 19 inch rack enclosure 307, an operator panel 308, an upper test section 309 and a lower equipment section 310. Each machine contains a main station 304 in which is mounted computer 305 and a test circuit monitoring control box 312. The operator panel of the main station contains the power control 313. A large, red emergency power-off (EPO) button is provided at the top of the main station. The EPO is connected to disconnect all power from every station upon activation. The enclosures may be bolted together as shown to form a unitary machine. A display 315, keyboard 316 and mouse 317 provide the primary user-interface with the computer.

Figure 22:
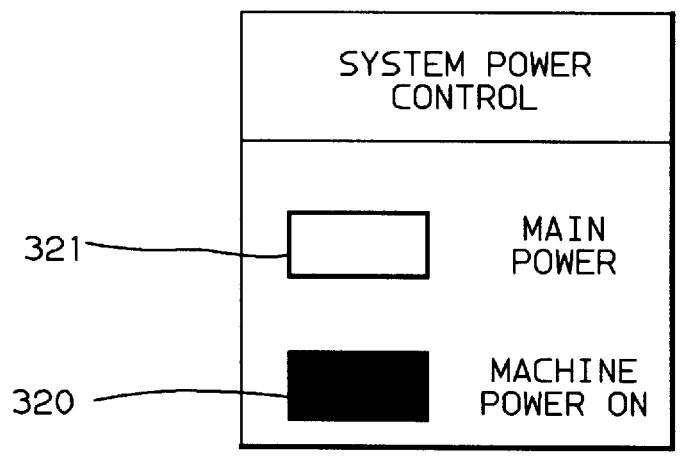
FIG. 22 is an expanded view of the power control area of the operator's panel of the main test station of FIG. 21.

FIG. 22 shows an expanded view of power control panel 313 which is on the operator's panel 308 (in FIG. 21) only on the main station 304. The power control includes a startup switch 320 (labeled "MACHINE POWER ON"), and a power on button 321 (labeled "MAIN POWER").

Figure 23:
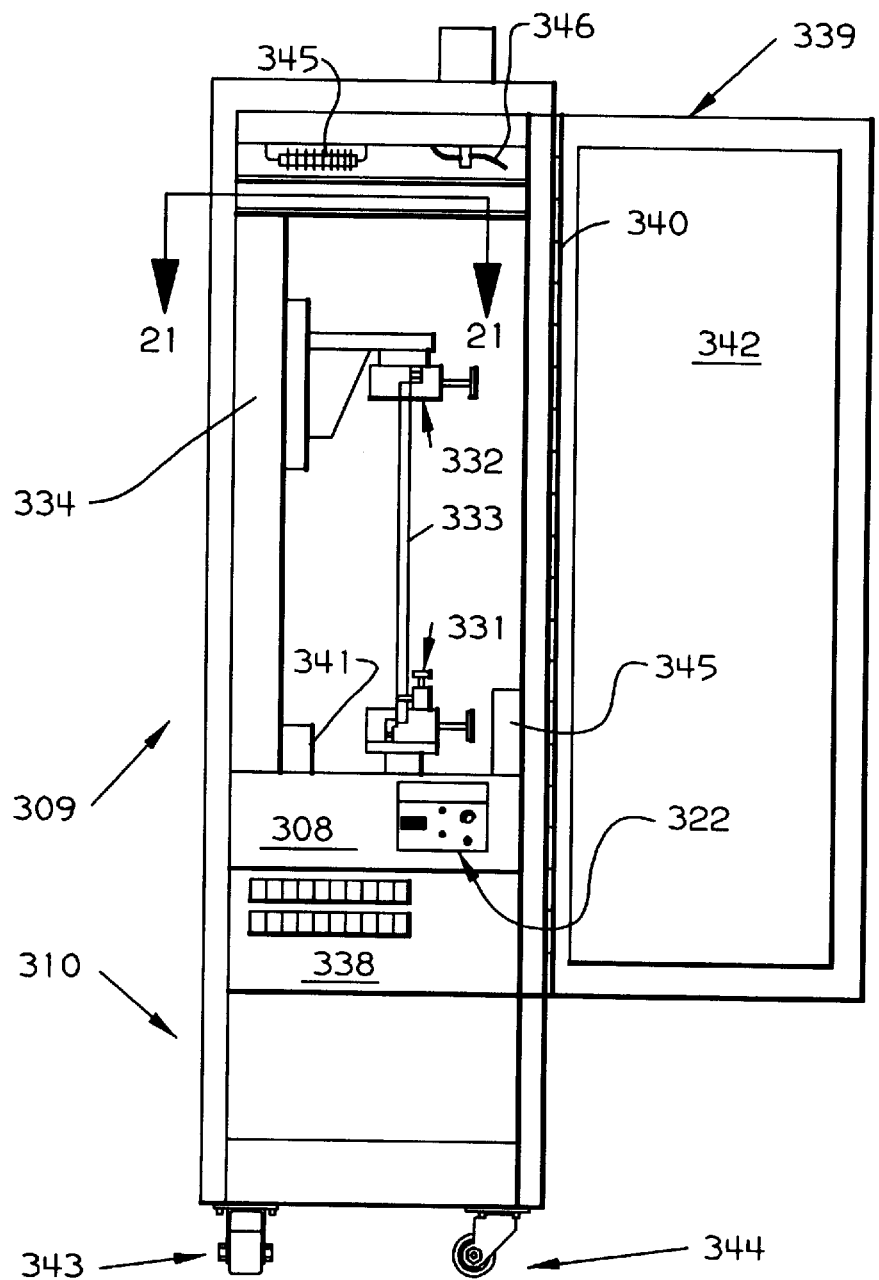
FIG. 23 illustrates one typical test station from FIG. 21.

FIG. 23 schematically shows a typical station. The test section contains a rotatable lower card clamp 331 and a rotationally fixed upper card clamp 332 for positioning card 333 during twist testing. The vertical position of the upper clamp is controlled by a linear positioning slide 334. Two stiffener plates 335, 336 minimize compliance of the machine. The lower section 310 is separated from the upper section 309 by a cowling that forms a horizontal bottom wall (not shown), a section that slants toward the front and forms the operator's panel 308, and a section 338 vertically covering part of the bottom section that can be accessed by removing the cowl. A front door 339 with a hinge 340, is opened for loading and unloading test cards. The machine includes an interlock 341 which prevents operation (twisting of the cards) when the door is opened. The door has a central section 342 of clear material (such as polycarbonate) through which testing may be safely observed. The test station is supported by casters 343, 344 for moving the tester, and the casters can be locked into position for stability.

Heater 345 is controlled by the computer system to maintain the enclosure at a preselected temperature during twist testing. Fan 346 circulates the atmosphere within the station.

Figure 24:
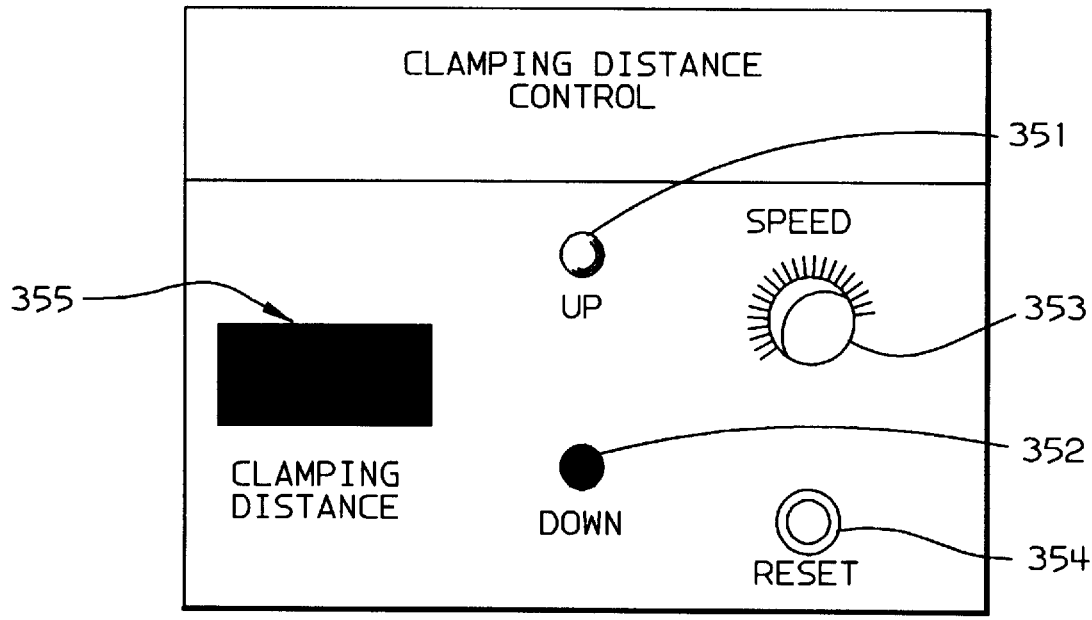
FIG. 24 is an expanded view of the distance control area of the operator's panel of any of the test stations of FIG. 21.

FIG. 24 shows the clamping distance control section 322 of operator's panel 308 of each test station 301–304 in FIG. 21. Push buttons 351, 352 move the upper clamp up and down respectively. Dial 353 controls the speed of the slide motor. A reset 354 is provided to move the clamp to a zero position. The distance between the clamps is automatically determined as described below and displayed at 355.

Figure 25:
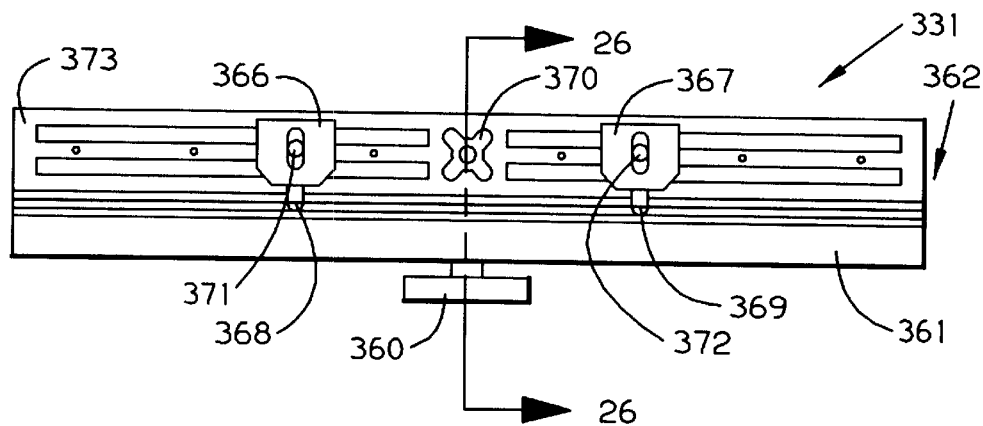
FIG. 25 shows a top view of the lower circuit card clamp of the tester of FIG. 23.
Figure 26:
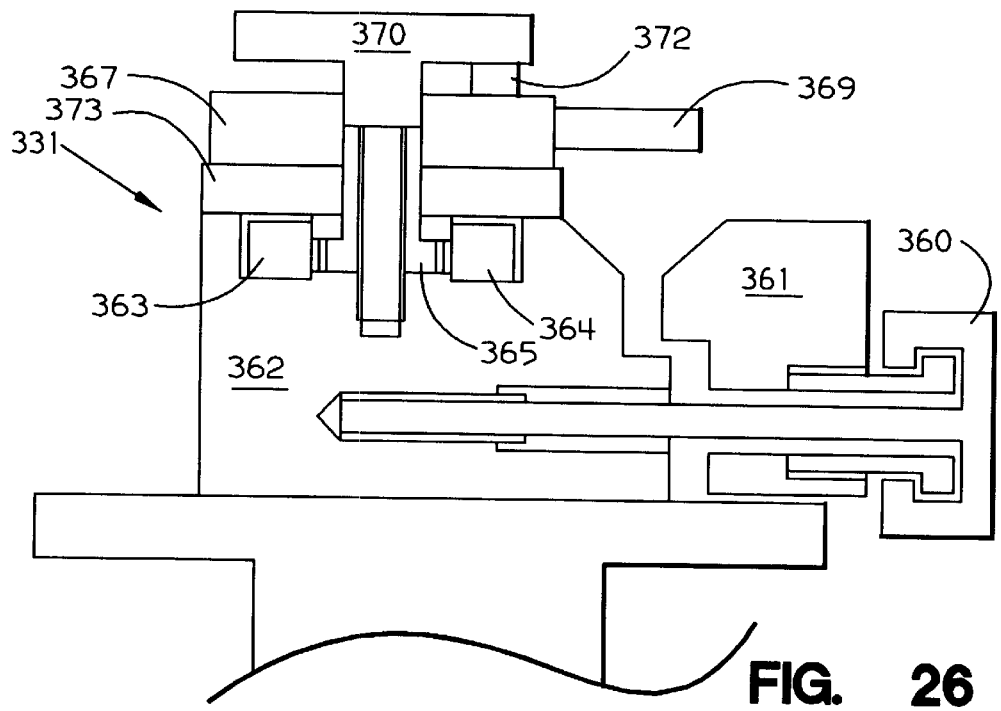
FIG. 26 is a partial sectional view taken through 25—25 of FIG. 25.

FIG. 25 is a top view of lower clamp 331 and FIG. 26 is a partial section thereof. Clamp knob 360 moves grip 361 (best seen in FIG. 26) horizontally with respect to support 362 to clamp a circuit card. Two gear racks 363, 364 positioned in keyways, communicate with pinion gear 365 to move the racks in the longitudinal direction of the clamp, equally and in opposite directions in their respective keyways. Each gear rack is mechanically connected (not shown) to one of the centering slides 366, 367 to move the slides relatively closer together or further apart in the longitudinal direction of the clamp. Thus, the distances between the longitudinal center of the clamp and each of the centering slides are always equal.

When a circuit card is loaded into the lower clamp, the slides are moved together and the circuit card position is adjusted until both pins 368, 369 are against respective lateral edges of the circuit card. This assures that the circuit card is exactly centered in the lower clamp. Then, lock knob 370 is turned to lock the pinion gear and hold the sliders in place. The circuit card can be removed pushing one of the slide activators 371, 372 to withdraw one of pins 368, 369 respectively to allow the board to slide out laterally. If another board of the same size is loaded in a similar manner it is automatically centered simply by moving one of the pin activators back, sliding the board laterally into the clamp until board is against the other pin, and releasing the pin so that the pins rest against the lateral edges of the board. Cover plate 373 holds the gear racks in the keyways and provides slots for supporting the centering slides and providing for the movement of the connection between each gear rack and its respective, connected centering slide as the centering slides move closer and farther apart.

Figure 27:
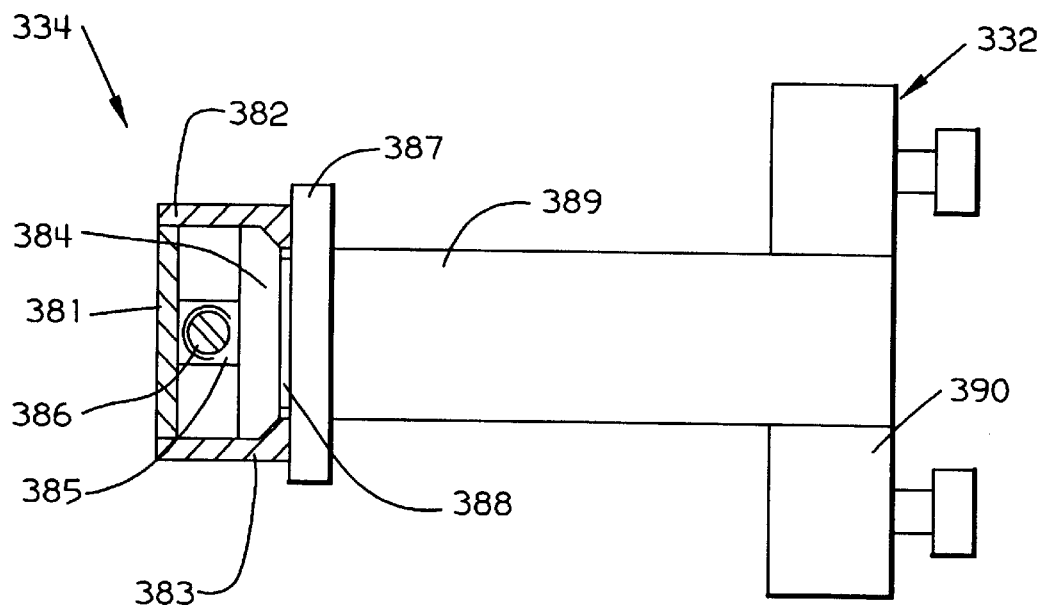
FIG. 27 is a partial section of the upper clamp, screw drive, and slide of the station of FIG. 23.

FIG. 27 is a top view of the upper clamp 332 with a partial section of slide 334. Slide 334 includes back plate 381, and side plates 382, 383. The upper clamp includes an inner sliding plate 384 connected to nut 385 which communicates with a jack screw 386 to selectively position the upper clamp in the vertical direction. The interior sliding plate communicates with an external sliding plate 387, interacting for sliding along slide 334. A spacer plate 388 connects the interior from the exterior sliding plates. The exterior sliding plate supports top support plate 389 which supports a top plate 390 of upper clamp 332.

Figure 28:
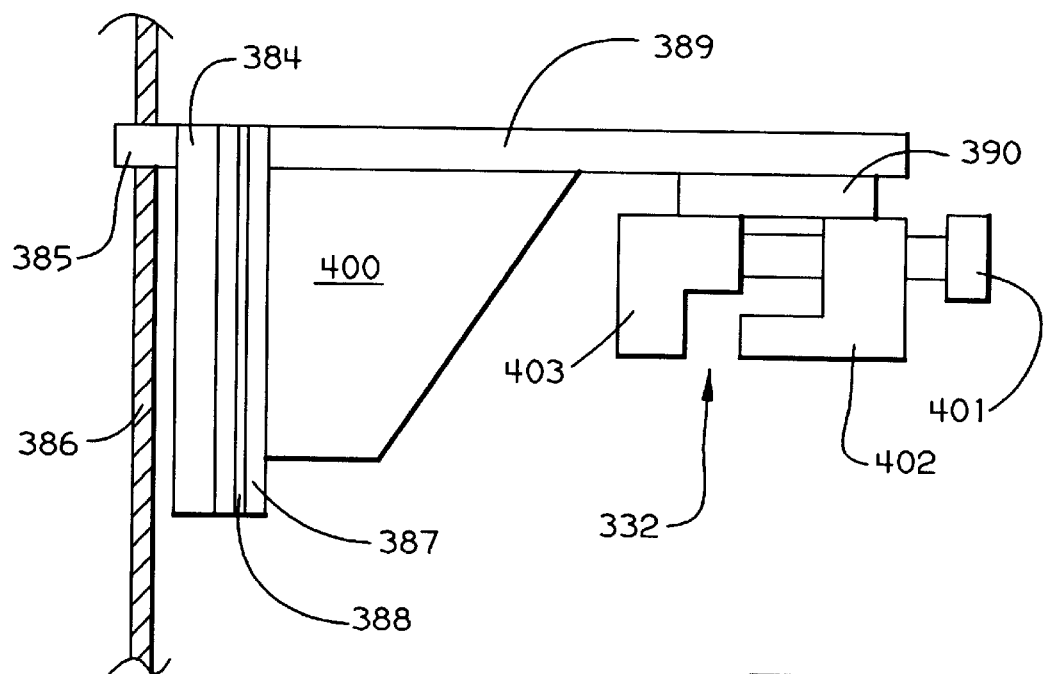
FIG. 28 is an elevation view of the upper clamp of FIG. 27 engaged with the screw drive.

FIG. 28 is a side view of upper clamp 332 with part of jack screw 386 shown. Stiffener plate 400 connects between top plate 389 and outer slide plate 387. Knob 401 moves slide jaw 402 closer/farther from fixed jaw 403 to clamp a circuit board for testing.

Figure 29:
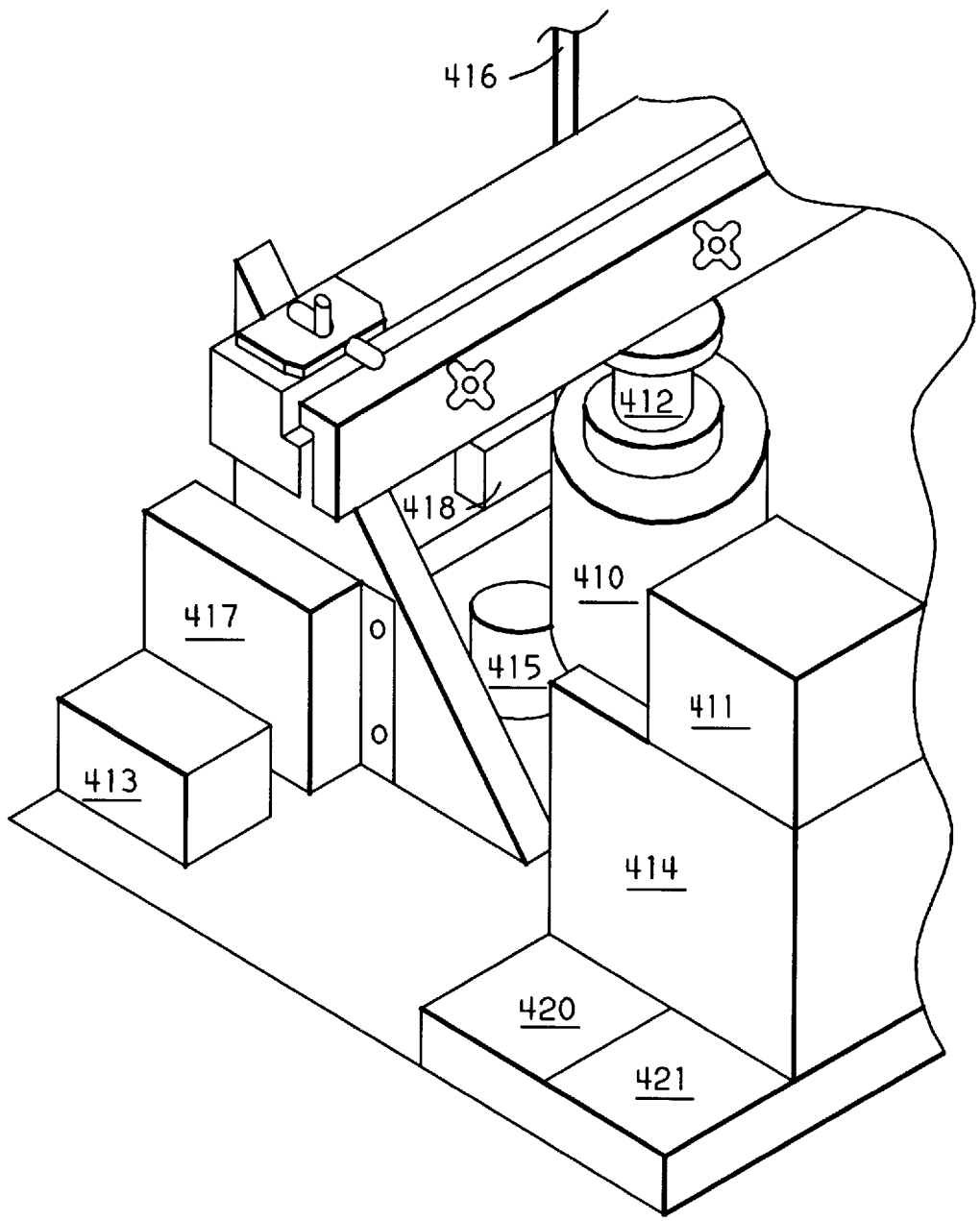
FIG. 29 is an isometric view of a part of the station of FIG. 23 with the cowling removed, showing a portion of the lower clamp, drive motors, and other station apparatus.

FIG. 29 is a schematic isometric view of the part of the typical test station of FIG. 23 under the cowling. Servo motor 410 (such as Compumotor Dynaserve™ model DR 1060B) (Dynaserve is a trademark of Parker Compumotor, Inc.) is rigidly mounted in the middle of the bottom section of each test station. Motor amplifier 411 regulates power to the motor and provides quadrature position feed back information signals. Torque transducer 412 measures the torque of the motor and is connected to torque signal unit 413 by wiring (not shown) to provide a conditioned torque signal (both are provided by Sensor Development Corporation). 12 volt DC power supply 414 provides power for limit switches (not shown), ultrasonic distance sensor (not shown), and torque meter 412. The slide motor 415 is connected to turn slide jack screw 416 to control the vertical position of the upper clamp (see FIG. 28). Slide motor control box 417 regulates power for the slide motor. Ultrasonic sensor 418 (CONTAQ Technologies) measures the vertical position of the top clamp to determine the distance between the clamps for display on the operator's panel, and logging by the computer for each test. AC power is distributed by terminal blocks 420, 421.

Figure 30:
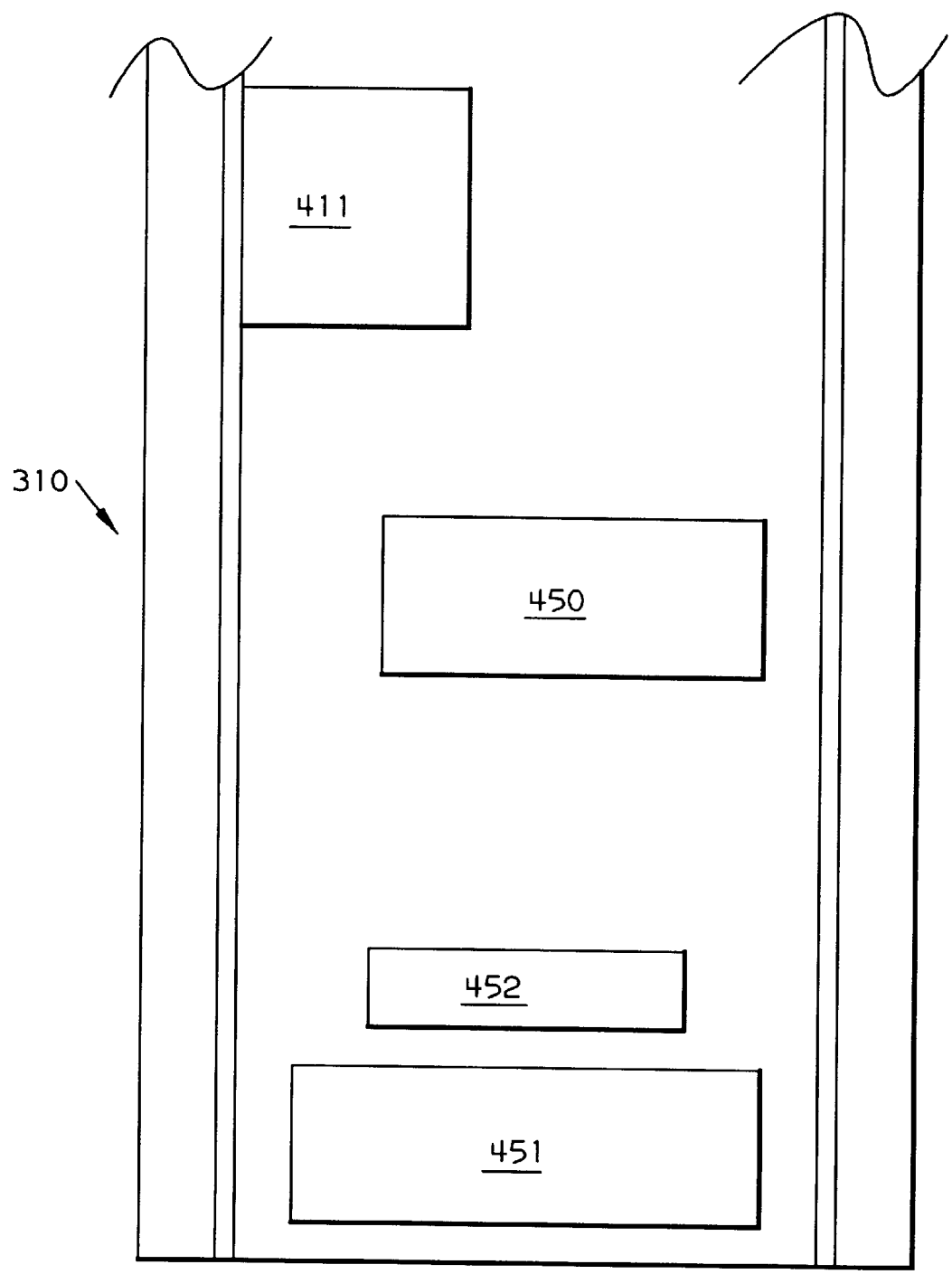
FIG. 30 is a rear view of the bottom section of the main station of the tester of FIG. 21 with the back door removed.

FIG. 30 is a rear view of bottom section 310 of the main test station 304 with the back door (not shown) opened. The back end of drive motor amplifier 411 is seen at the top left of the drawing. Cable interface board 450 connects the main station with any other stations in the machine. AC power box 451 provides for connection to AC power which is distributed to terminal blocks 420, 421 in FIG. 29. An AnaTech Test Circuit Monitor 452 (glitch detector) is also provided for locating failures during torsioning. This glitch detector simultaneously monitors 40 channels for any change in resistance. The detector is programmed to set on any decrease in resistance and to signal the computer system when such a glitch is detected. Applicants prefer a glitch detector to a scanning detector because the failures are typically cracks that open intermittently during cycling, which a scanning detector could miss.

Although control of the machine and analysis could be provided purely by permanently configured hardware, it is convenient to provide a general purpose computer system which is configured during operation to provide the necessary apparatus to provide the required functions.

Figure 31:
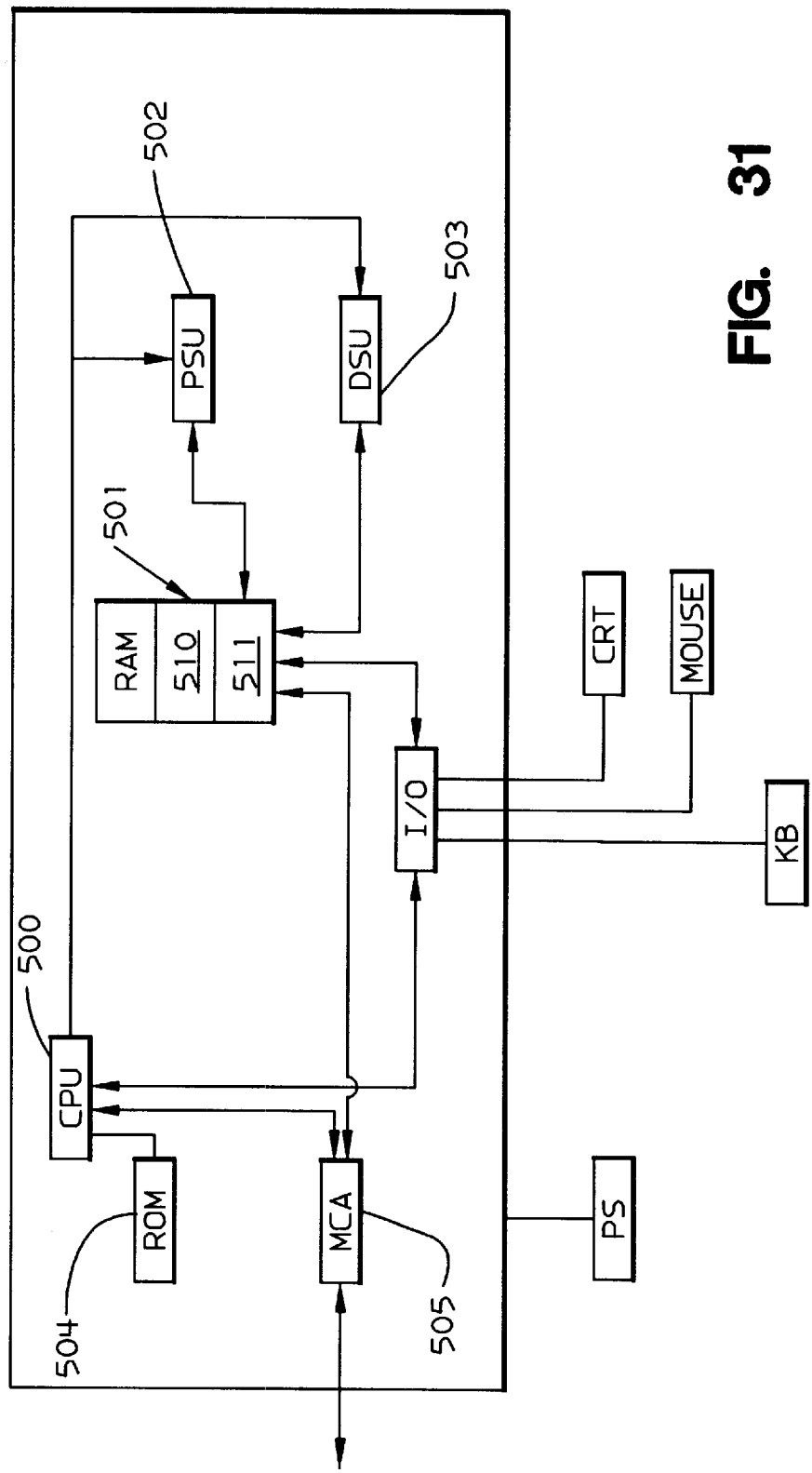
FIG. 31 is a schematic of the computer system of the main station of the tester of FIG. 21.

As shown schematically in FIG. 31, the computer preferably includes a CPU 500, RAM 501, a program storage unit (PSU) 502, a data storage unit (DSU) 503, and ROM 504. The ROM is used to initially transfer signals from the PSU to configure the RAM to provide various apparatus needed to control the CPU for controlling the machine during testing and analysis. The computer includes a motor control adapter (MCA) 505, such as an 8-axis Delta Tau PMAC-PC adapter, to control the various motors in the machine. The storage units include magnetic switches, optical switches, solid state switches or other machinery to cooperate with apparatus to generate signals to configure the RAM to provide apparatus required to control the CPU. The PSU and DSU storage devices can be combined if desired. During operation the RAM includes apparatus to present menus to the user and react to function keys, action bars, or mouse input (not shown). The RAM also includes control apparatus 510 to control the machine during testing and analysis apparatus 511 to perform the statistical data analysis required of the system.

Figure 32:
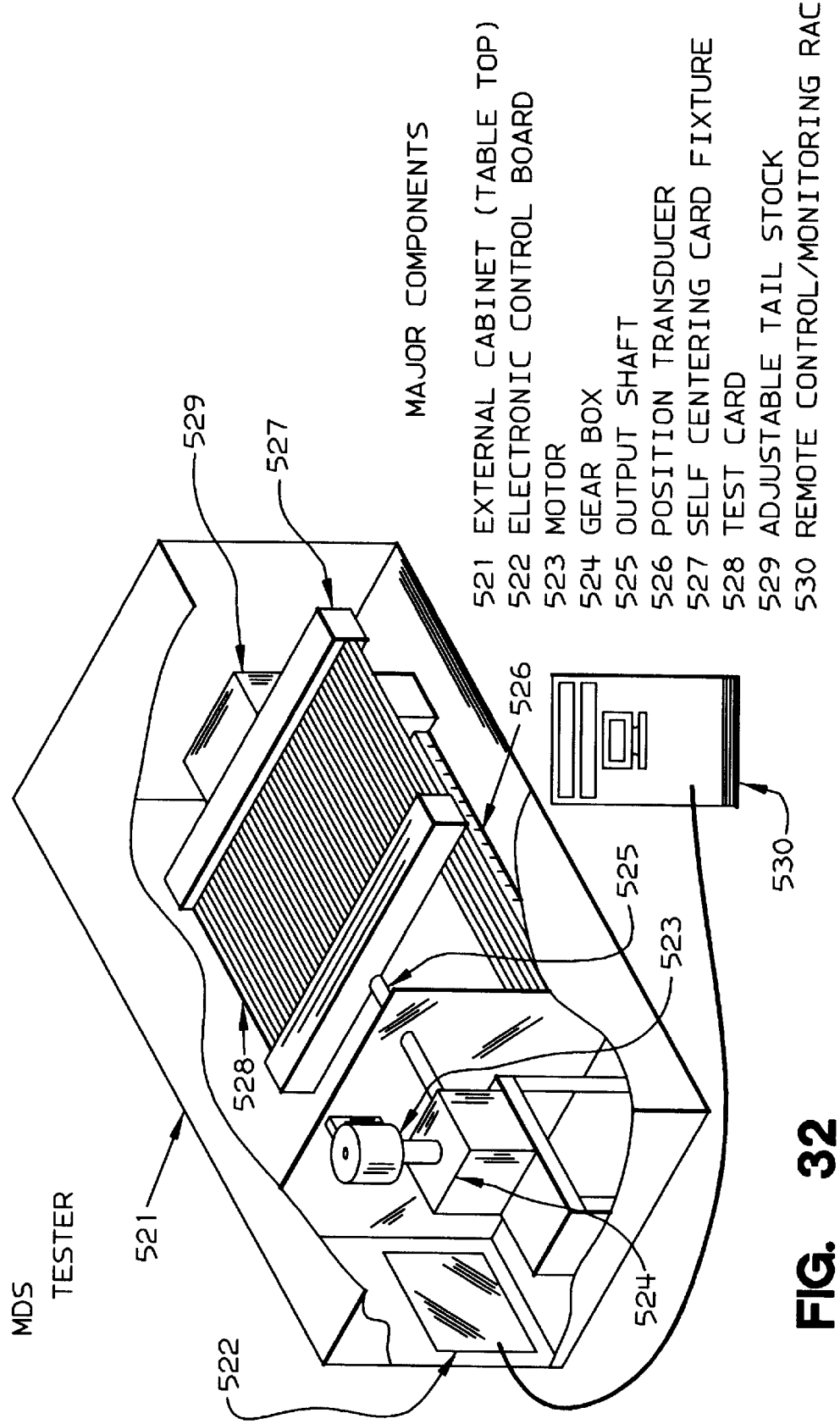
FIG. 32 illustrates a second specific embodiment of an MDS tester of the invention.

FIG. 32 illustrates another specific embodiment of the MDS machine of the invention. An exterior cabinet 521 houses the components of the twist tester portion of the machine. The enclosure contains an electronic control board 522 which controls motor 523 which drives gear box 524 to rotate shaft 525 to twist circuit card 528. Self centering clamp 527 is rotatably fixed to tail stock 529 which can be adjusted to regulate the distance between the clamps. A controller 530 is connected by cable 532 to electronic control board 522 to control the testing in accordance with predetermined test procedures.

Figure 33:
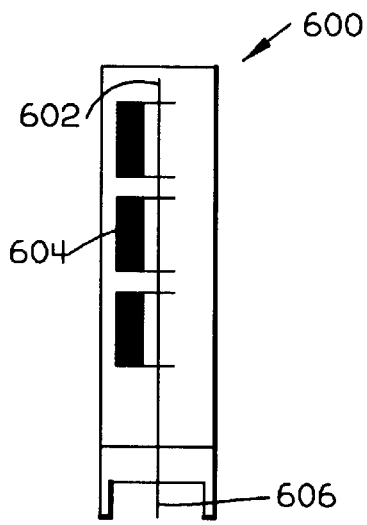
FIG. 33 is a schematic showing a solid state embodiment of the signal generating system of the invention for programming the RAM of the computer system of FIG. 31 to provide various apparatus for testing and analysis of circuit assemblies.

FIGS. 33–36 show examples of signal generating devices of the invention to program the computer system or controller of the MDS test machine for controlling the operation of the MDS tester. FIG. 33, shows a program cartridge 600 such as a PCMCIA card, which typically includes a circuit card 602 on which are mounted discrete devices to generate signals, or, more preferably, solid state memory devices 604 such as photo-lithographically programmed structures of a ROM chip or electrically programmed EPROM, EEPROM, bubble memory, battery backed SRAM, or flash memory chips. The devices are interconnected by a wiring layer (not shown), for example, on either surface of board 602. Programming may be used in a well-known manner to provide the required functions in the memory, or discrete circuits may be generated by a program. Connector 606 of the cartridge is inserted into a port or slot of the MDS machine for transmitting the signals which control the CPU of the tester. Alternately, the MDS tester may have a circuit card with sockets into which solid state memory devices 604 are directly inserted.

Figure 34:
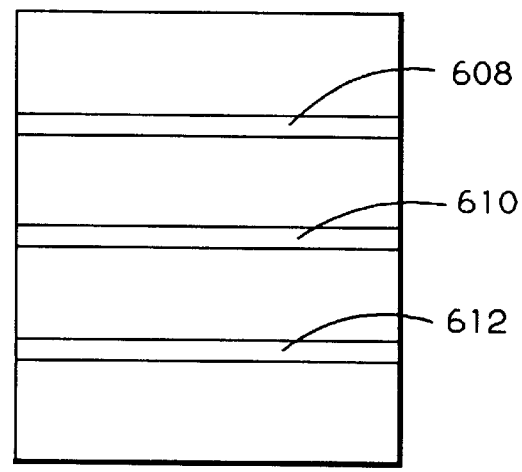
FIG. 34 is a schematic illustrating a map of the memory of the device in FIG. 33 showing discrete devices provided to program the RAM of the computer system of FIG. 31.

In FIG. 34, a memory map of the solid state memory devices includes separate apparatus sections 608, 610, 612, one or more of which carry out one or more of the functions of the invention. For each of the generating device embodiments one or more of these sections provide one or more apparatus which include: apparatus for controlling a motor for rotating a clamp for cyclicly twisting a circuit card at preselected frequency and twist angles; apparatus for monitoring a temperature signal of a twist test chamber; apparatus for automatically counting the number of cycles during the twist test; apparatus for receiving data for a multitude of failures for a circuit card; apparatus for relating the failure data to the number of cycles that have been counted prior to receiving the data to produce a distribution of failures by cycle; and apparatus for storing the failure distribution (including location and cycle data for each failure) in a database for later access. In addition, for each generating device embodiment one or more of these sections preferably include one or more of: apparatus for automatically determining the angle to twist a card depending on input card size, thickness, and technology; apparatus for storing a predetermined termination failure count; apparatus for automatically terminating the twist test depending on the termination failure count and the number of failures that have been received; apparatus for storing a predetermined termination cycle count; apparatus for automatically terminating the twist test depending on the termination cycle count and the number of cycles that have been counted; apparatus for measuring the maximum angle of twist or the maximum torque for each twist cycle and storing data related to the maximum angle or maximum torque; apparatus for identifying the process or technology for a failure distribution; apparatus for comparing failure distributions to identify anomalous differences; apparatus for generating a combined failure distribution (e.g., by averaging) from a multitude of stored distributions for cards to form base-line or reference distributions of expected failures for a particular process and technology; apparatus for determining the reliability of cards made by a process by normalizing a distribution of fails for the card depending on a generated base-line distribution; apparatus for receiving failure signals from a circuit card as they occur during testing; apparatus for receiving locations for failures; apparatus for relating the failure location to the number of cycles to produce a distribution for failures by location and cycle; storing the distribution with failure locations related to failure cycles; apparatus for storing failure distributions for a plurality of circuit cards.

Figure 35:
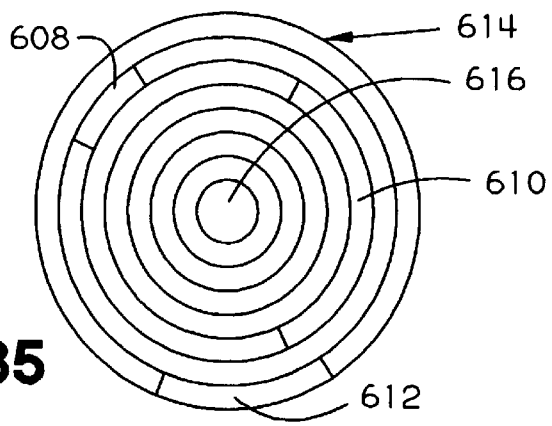
FIG. 35 is a schematic showing a floppy disk embodiment of a signal generating system of the invention.

FIG. 35 shows a disk 614, which may include a floppy plastic substrate such as a disk or a tape, covered by ferromagnetic particles which can be magnetically oriented and used to generate digital signals when moved relative to an inductor or resistor head. Alternately the magnetic particles may be on a card which is moved or swiped in relation to the head. Usually the magnetic field generated by the magnetic particles is transduced into electrical signals in a read or read/write head of a disk drive as the disk spins about hole 616. Alternately, the disk may be coated by a medium with a reflectance which is controlled to provide radiation signals when a laser beam is directed to reflect off the surface as the disk spins about the center hole. Alternately, the laser beam can be directed to scan over the surface of a fixed card. A detector of electromagnetic radiation transduces the reflected optic signals to provide digital electrical signals. A spiral track or a plurality of round concentric tracks is divided up into apparatus sections such as 608, 610, 612 and one or more of the sections are used to provide one or more of the apparatus described above in relation to the solid state signal generating device of FIG. 34.

Figure 36:
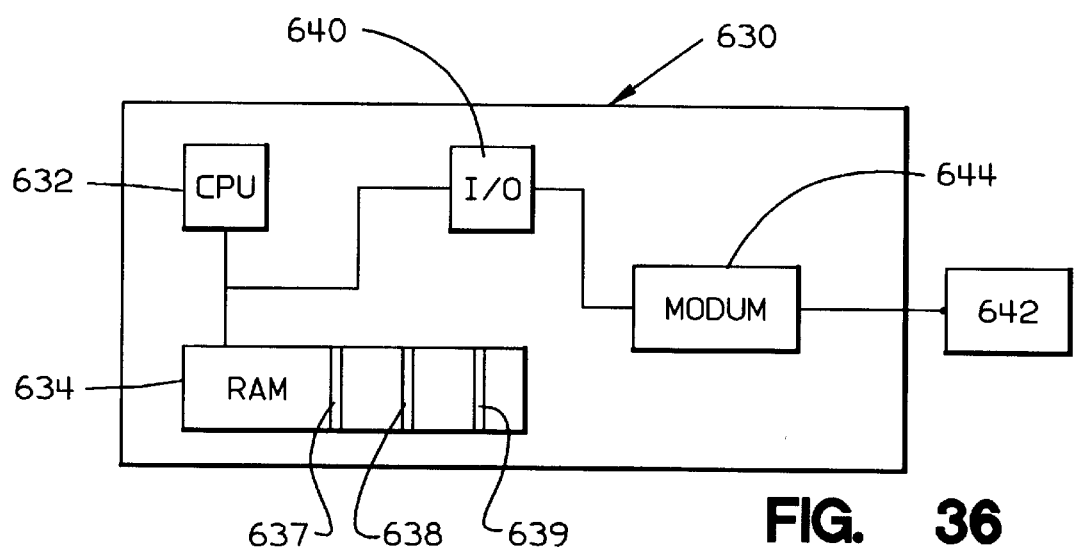
FIG. 36 is a schematic showing a computer system embodiment of a signal generating system of the invention.

FIG. 36 shows a computer system 630 with one or more CPU's 632 communicating with memory 634 (registers, SRAM, DRAM, and/or EEPROM) which contains apparatus sections 637, 638, 639 which are discrete circuits or more preferably transistor memory devices which have been configured, for example, by using a program to provide the desired apparatus, described above in relation to the solid state signal generating device of FIG. 34. The CPU(s) and memory 634 communicate with an input/output controller 640 to transmit signals onto an external communications network 642, to which the computer system of the operator station of FIG. 31 is connected (not shown). The network may be any type of network through which computer systems communicate. For a telephone network, MODEM 644 is required to convert voltage level signals to frequency signals, which are transmitted to a second similar MODEM (not shown) which is connected to the system of FIG. 31.

FIG. 37 shows another embodiment of the MDS machine of the invention with a general purpose work station 650 (such as an IBM model 350) connected to a bench top twist test unit 651 by network cable 652. The work station includes a CPU unit 653, a display 654, a keyboard 655, and a mouse 656. The CPU unit includes a disk drive 657 for programming the unit.

The twist test unit includes a front door 660 of an upper oven portion with handle 661 for opening the door. Below the door is a cover 662 with control panel portion 663 on which selected controls are mounted.

FIG. 38 is an expanded view of the control panel portion 663 of cover 662 of FIG. 37. The controls on the cover include controls for moving the top clamps up and down, including a clamp jack speed control dial 663 and a three-position rocker switch 664 for jack direction up, down, or stationary. A temperature is input into a temperature set pad 665 for the heater and a tolerance is input into a temperature range set pad 666 which are used to generate an out of range signal to the computer system if the temperature fluctuates out of the selected range. Momentary contact buttons 667, 668 turn the heater on and off respectively. A momentary contact switch 669 turns power to the twist test unit on and off.

Figure 39:
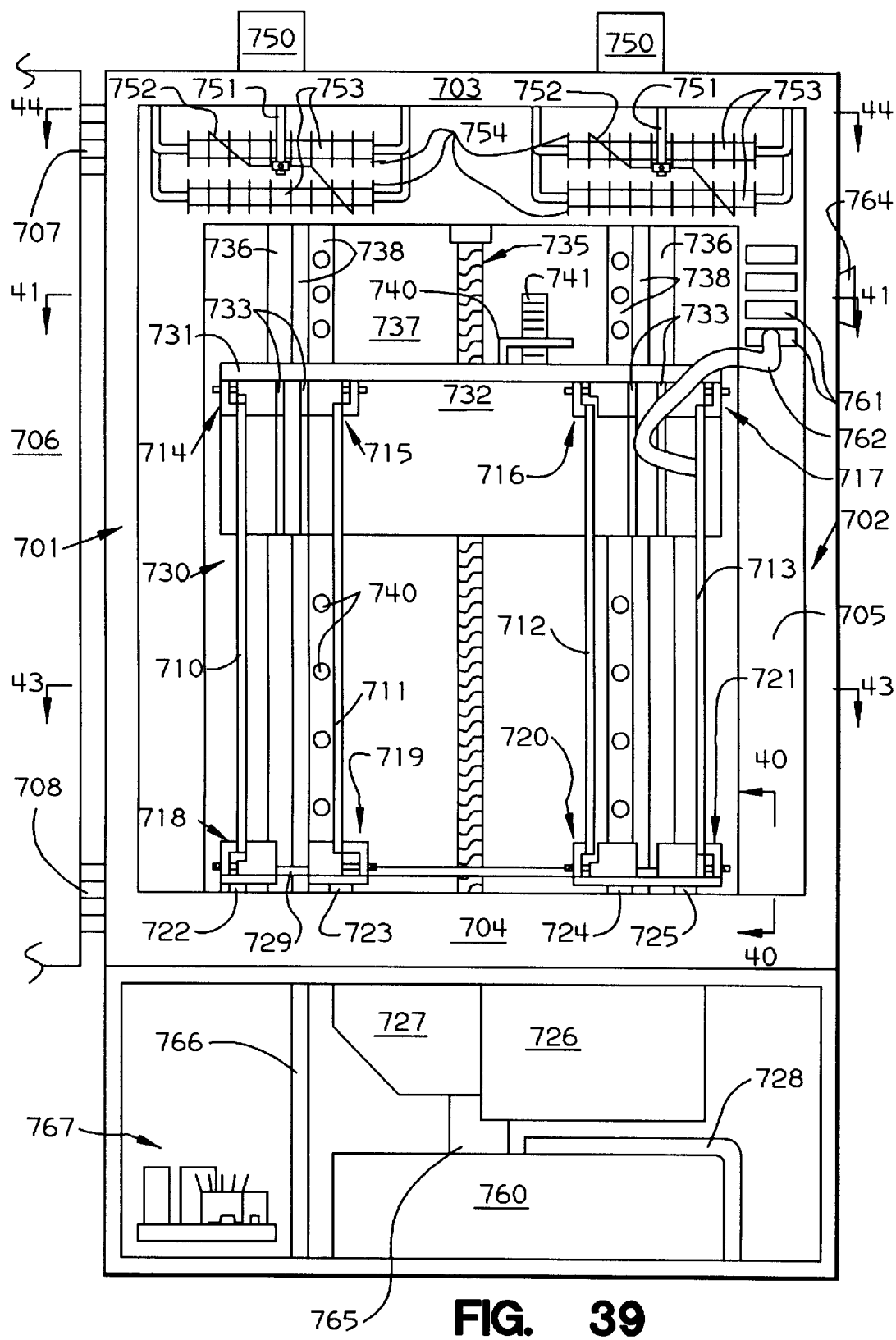
FIG. 39 shows a front view of the torsioning machine of FIG. 37 with the front door opened.

FIG. 39 shows the third embodiment of the MDS machine of FIG. 37 with the front door open and the cover removed. The oven enclosure consists of thick insulated left and right side walls 701, 702 respectively, top and bottom walls 703, 704, respectively back wall 705, and a door 660 on hinges 707, 708. Four (4) circuit card assemblies 710, 711, 712, 713 are held between rotationally fixed top clamps 714, 715, 716, 717 respectively and rotatable bottom clamps 718, 719, 720, 721 respectively. Each of the rotatable clamps is supported on a rotatable axal 722, 723, 724, 725. Under the oven, torsion motor 726 is connected to transmission 727, which drives axal 723 to rotate clamp 719 in the oven. Motor controller 728 controls the rotation of the torsion motor. The motor and controller may be a stepper unit such as Compumotor Dynaserve™ SX-83-135-E (with encoder). Preferably, an angle sensor (not shown) is used to control the stepper motor. Beam 729 is pinned (shown below in FIG. 40) to the back end of each rotatable clamp so that each clamp is driven to rotate synchronously by an equal amount by a single torsion motor.

The top clamps are supported by a slide assembly 730. The clamps are connected to horizontal top support plate 731, which is connected to vertical back support plate 732. Struts 733 extend from the side of each top clamp to the bottom edge of the back support plate. Jack screw 735 is used to adjust the distance between the top and bottom clamps. The slide assembly is connected to slide along round slide rods 736, which are connected to a back support wall 737 by angle beams 738. The back side of angle 738 is connected by screws 740 to the back support wall.

Fan motors 750 (e.g., Fansco PN D504) drive shafts 751 to rotate fans 752 to circulate the atmosphere of the twist test oven. Electric heaters 753 with fins 754 heat the oven according to settings on the front cover. A thermocouple (not shown) within the chamber preferably attached to one of the circuit card assemblies is used to determine temperature. The heaters are capable of quickly heating the oven and its contents up to a working temperature as high as 140° C. and maintaining the temperature within a few degrees.

Below the oven, behind the front cover, a glitch detection system 760 may be connected to detect any change in the resistance in the lines connected to the circuit cards. This system is similar to the AnaTech Test Circuit Monitor discussed above, but is able to monitor 160 channels for changes in resistance. The glitch detection system may be connected to ports 761 by cables 762, (only one is shown for convenience) which plug into circuit card assemblies 710–713. Alternately or in addition, the boards may be functionally tested by connecting them to cables routed through a port 763 (shown in FIG. 41 below) covered by door 764 (e.g., a rubber stopper). Also below the oven, jack motor 765 (Minarik PN 507-01-129) is connected to rotate jack screw 735. A wall 766 separates power supply 767 from the other components.

Figure 40:
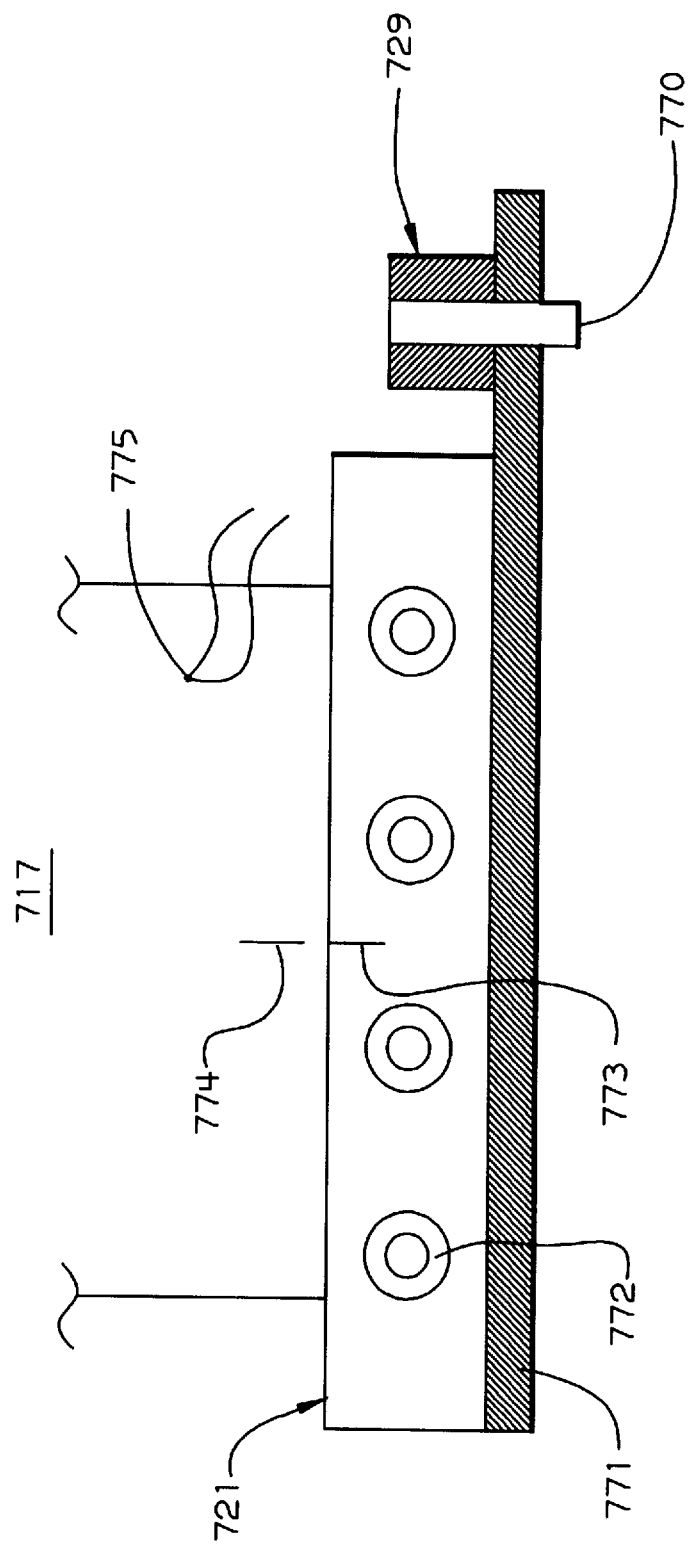
FIG. 40 illustrates a partial section through lines 40—40 of the machine of FIG. 39, showing only a portion of a circuit board inserted into a rotatable bottom clamp.

FIG. 40 is a partial section of the machine of FIG. 39 through lines 40–40, showing only one clamp 721. Beam 729 is connected by pin 770 to the bottom plate 771 of each respective clamp. Knobs 772 tighten the clamp to hold circuit card 713 in position. Mark 773 on the bottom clamp is aligned with center mark 774 of the circuit card to align the circuit card with the bottom clamp. The upper clamps will be aligned with the circuit card by aligning the bottom clamp with the circuit card. A thermocouple 775 is connected to the card assembly communicates with temperature set pad 665 and range pad 666 so that a temperature signal can be transmitted to the workstation.

FIG. 41 is a partial section along lines 41–41 of FIG. 39 showing the slide assembly connected to the jack screw and slide rods. The door 660 is shown closed. Horizontal plate 731 is connected to vertical plate 732. Screws 740 connect angle beam 738 to back support plate 737 and screws 780 connect angle beam 738 to slide rods 736. The horizontal plate 731 is cut away at 781 to show a sectional view of screws 782 connecting the vertical plate 732 to C-bearings 783.

FIG. 42 shows an enlargement of a portion of FIG. 41 which connects between the vertical plate 732 and the C-bearing 783.

Figure 43:
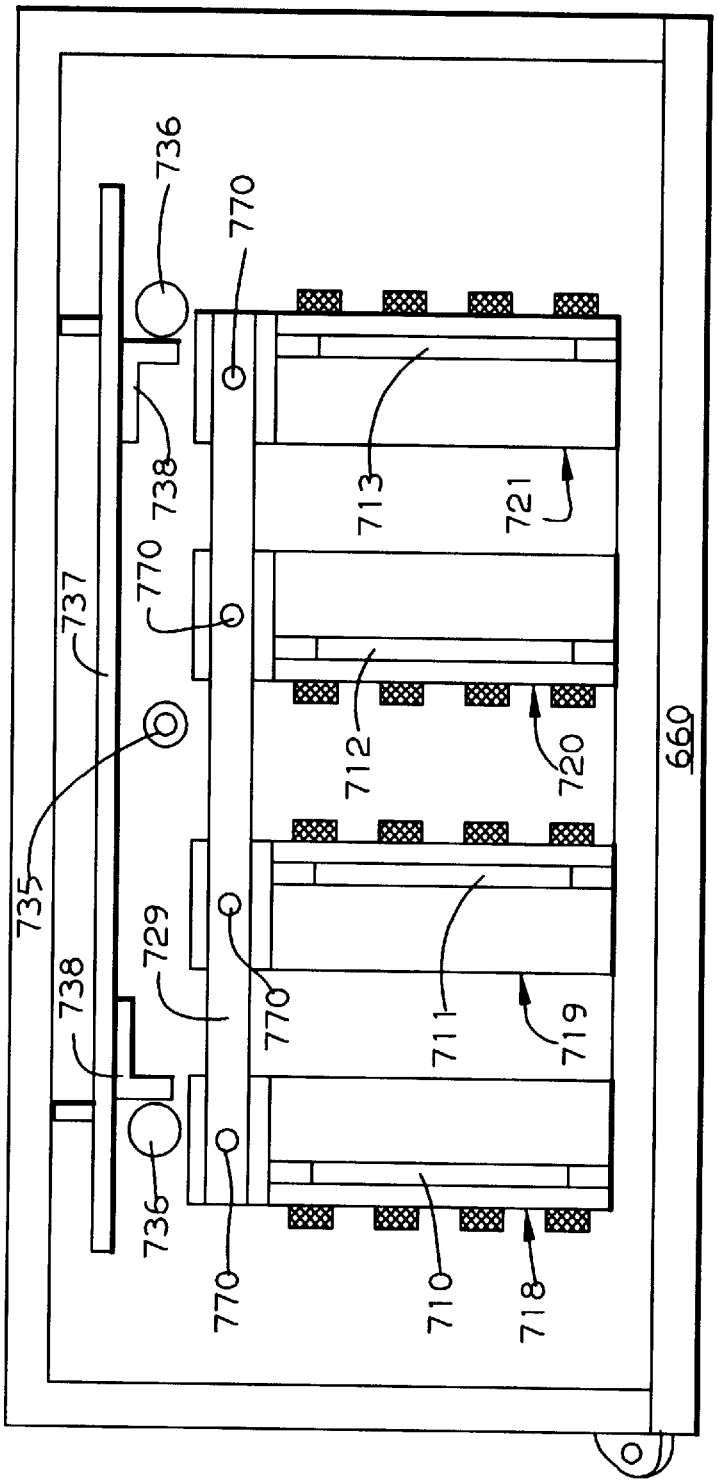
FIG. 43 is a partial section through lines 43—43 of the machine of FIG. 39 showing the four lower rotatable clamps connected by a rod at the bottom of the oven.
Figure 44:
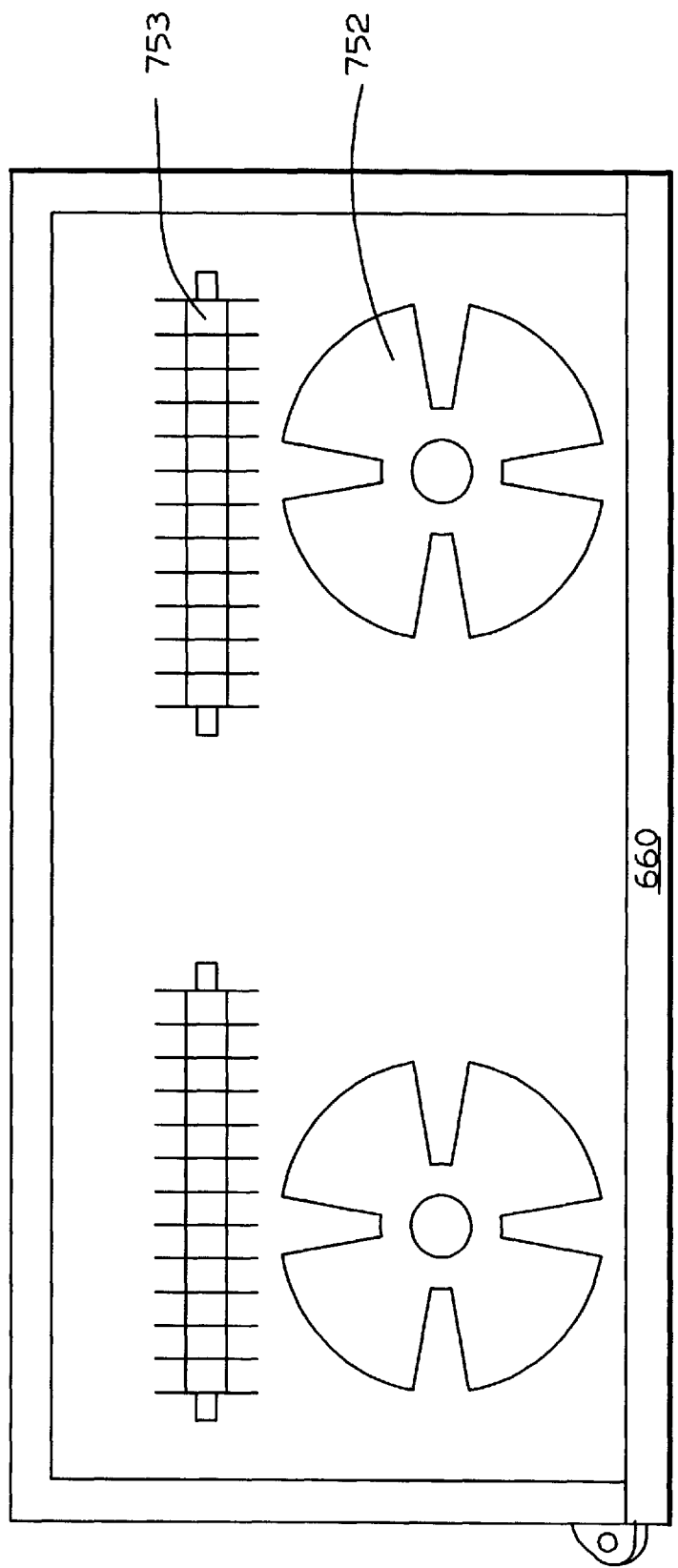
FIG. 44 is a partial section through lines 44—44 of the machine of FIG. 39 showing the heaters and fans at the top of the oven.

FIG. 43 is a partial section along lines 43–43 of FIG. 39 showing the four rotating bottom clamps 718–721 connected by pins 770 to beam 729. Again the door 660 is shown closed. FIG. 44 is another partial section along lines 44–44 of FIG. 39 but showing nothing below the fans 752 and electrical heaters 753 at the top of the twist test oven. Again door 660 is shown closed.

FIG. 45 illustrates a specific example of a testing process of the invention. In step 790, twist angle and cycles till completion of the test (termination cycle count) are inputted into the computer system. In step 792 test temperature and temperature tolerance is input into the control panel. Alternately the temperature may be input and/or controlled by the computer system. In step 794, the system starts heating the oven enclosure and contents, and automatically commences twist testing when the temperature reaches the input test temperature. In step 796, if the temperature signaled fluctuates beyond the selected tolerance then the computer is signalled to terminate the test and notify the operator. Otherwise, the test continues until the cycles till completion is reached. Although the invention has been described specifically in terms of preferred embodiments, such embodiments are provided only as examples.

Figure 46A:
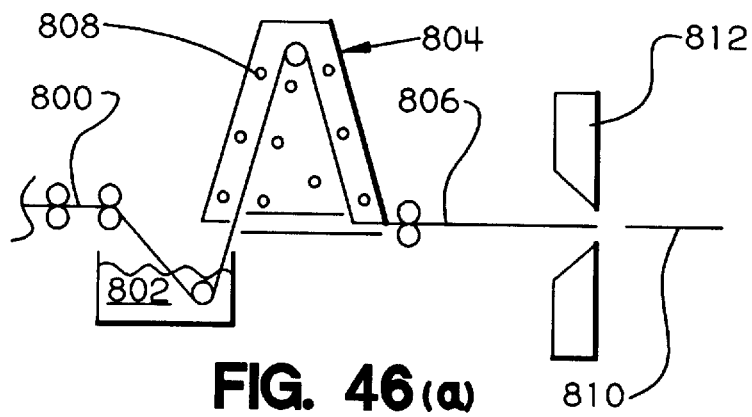
FIG. 46a shows a treater tower apparatus for use in the circuit board producing process of the invention.
Figure 46B:
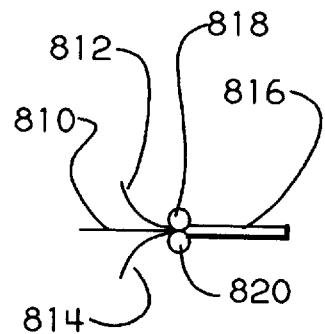
FIG. 46b shows a laminator for use in the circuit board producing process.

FIGS. 46a–46h schematically illustrate apparatus for producing circuit boards. In the treater tower of 46a woven fiberglass cloth 800 moves continuously through a supply of epoxy resin 802 and through oven 804 where the continuous substrate is partially cured to a B-stage at 806 by heating elements 808. The continuous substrate is cut into prepregs 810 by moving blades 812. The prepregs are used as circuit board substrates. In the laminator of FIG.46b the prepreg and layers of material 814,816 are laminated together into an assembly 816 as the stack moves between heated rollers 818,820. Typically the stack includes a copper foil on each side of the prepreg and a dry photoresit film on the exterior side of each foil.

Figure 46C:
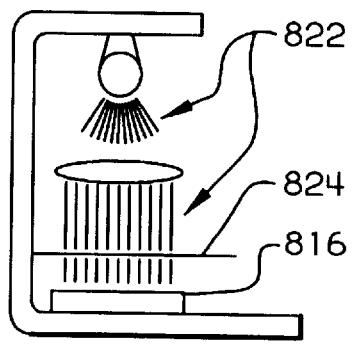
FIG. 46c shows a photo exposer for use in the circuit board producing process.
Figure 46D:
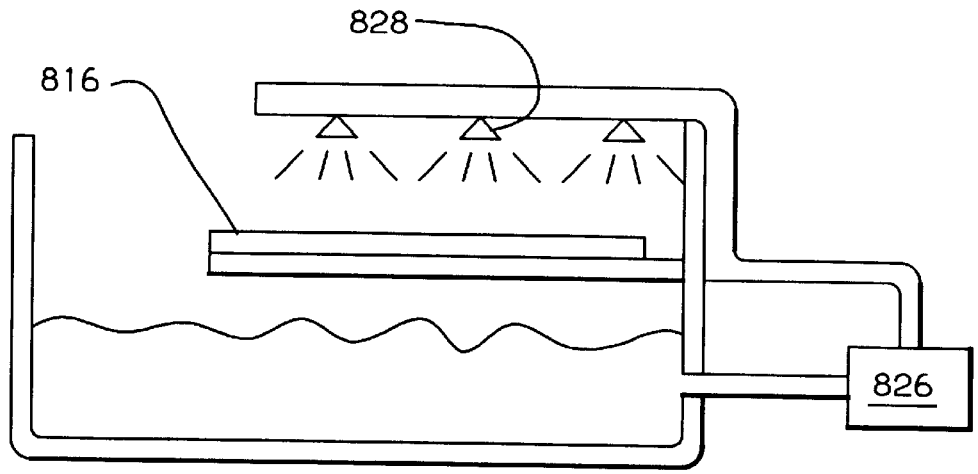
FIG. 46d shows a sprayer for use in the circuit board producing process.

In the photo exposer of FIG. 46c the photoresist layers on the surface of assembly 816 are exposed to light 822 through mask 824. In the sprayer of FIG. 46d a pump 826 sprays liquid through nozzles 828, onto assembly 816. In this sprayer, the photoresist is developed to form a pattern of photoresist which protects a portion of the copper foil which defines a wiring pattern (not shown) of copper, then other portions of the copper foil are etched away, and then the protecting photoresist is stripped away to produce a circuitized substrate 816.

Figure 46E:
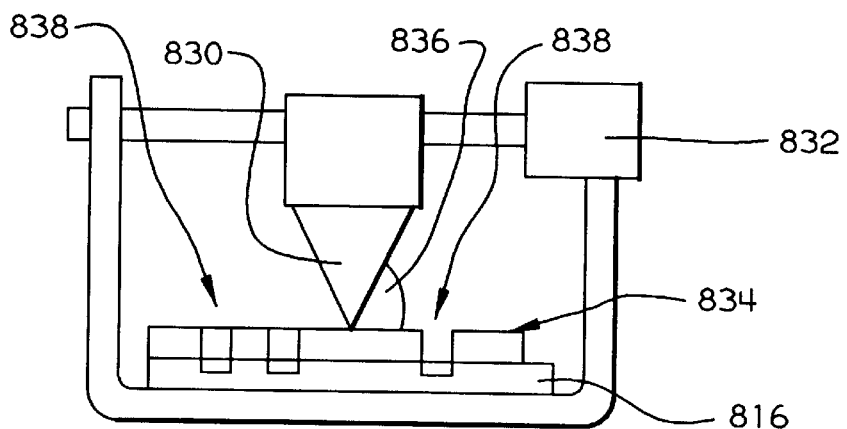
FIG. 46e shows a screen printer for use in the circuit board producing process.
Figure 46F:
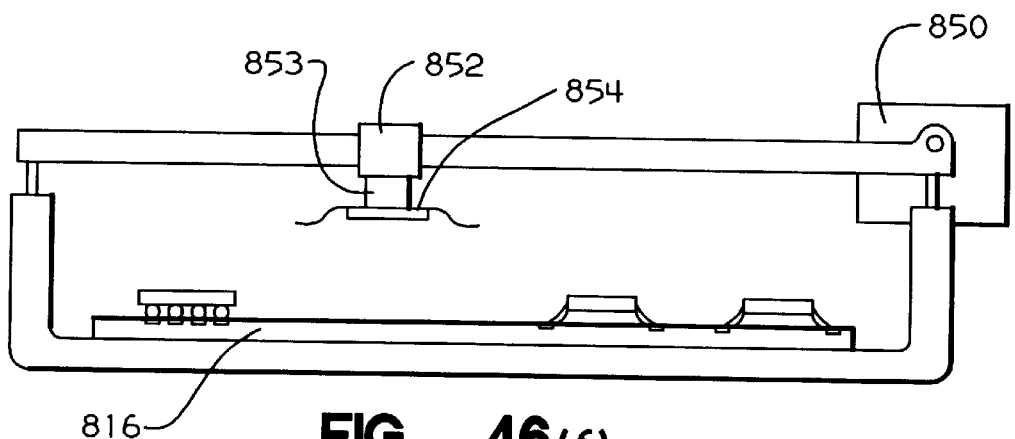
FIG. 46f shows a pick and place machine for use in the circuit board producing process.
Figure 46G:
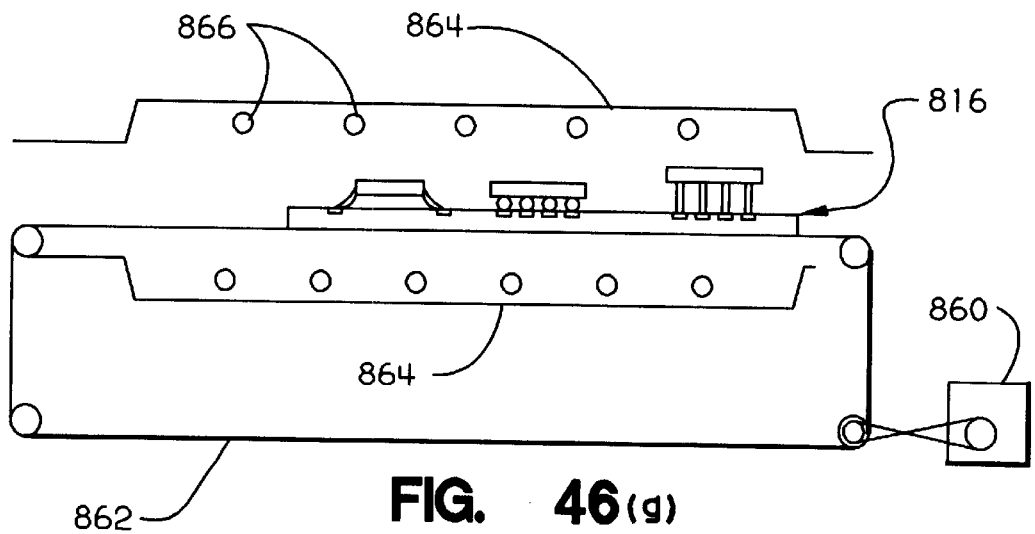
FIG. 46g shows a reflow oven for use in the circuit board producing process.

In the screen printer of FIG. 46e a squeegee 830 is moved by motor 832 across a mask 834 to deposit solder paste 836 into holes 838 in the mask and onto connection pads (not shown) of the wiring pattern on substrate 816. In the pick and place machine of FIG. 46f motor 850 moves head 852 with vacuum tip 853 to pick up SMT components 854 and place the components on the circuitized substrate 816 with terminals of the components on the solder paste on the connection pads of the wiring layer of substrate 816. In the reflow oven of FIG. 46g, motor 860 moves conveyer 862 to move substrate 816 through the oven enclosure 864. Heating elements 866 are controlled to provide a preferred reflow temperature profile. In the oven the solder paste is reflowed to form molten solder alloy between the terminals and the pads. Upon leaving the oven the solder joints cool to form solid joints of solder.

Figure 46H:
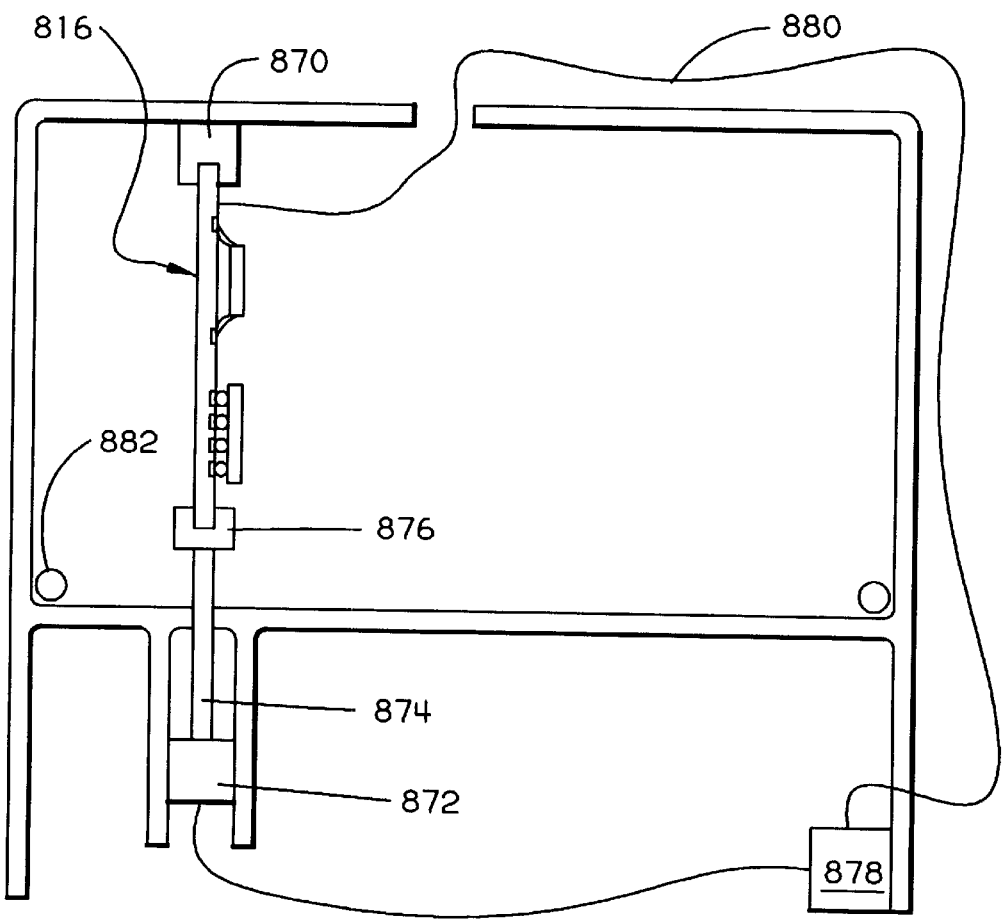
FIG. 46h shows a motor and clamp assembly for use in the circuit board producing process.

In the heated twist tester of FIG. 46h, circuit card assembly 816 is held by stationary clamp 870 and twisted by motor 872 connected by a rotating shaft 874 to an active clamp 876. The position of the motor and clamp assembly can be adjusted to adjust the distance between the clamps. The assembly is clamped in place, connected to computer 878 by cable 880, heated up to a test temperature by heater elements 882, and then computer 878 controls the twisting of the clamp by the motor and records failure data as described above. The results of the testing are used to identify process defects and optimize the variables of all the steps of the circuit card assembly production process.

Those skilled in the art are expected to make numerous changes and substitutions, including those discussed above, in arriving at their own embodiments, without departing from the spirit of the present invention. Thus, the scope of the invention is only limited by the following claims.

TABLE 1

|  | MDS MEAN LIFE $N_{50}$ | STANDARD DEVIATION $\sigma$ |
| --- | --- | --- |
| REWORK | 797 | 0.771 |
| STANDARD | 1183 | 0.152 |
| LEAD-ON-CHIP | 2677 | 0.183 |

We claim:

1. An information handling system, comprising:
   means for determining when card assemblies are at testing temperature;
   means for initiating stress testing depending on the determination that card assemblies are at testing temperature;
   means for setting the amplitude of displacement of card fixturing during stress testing;
   means for setting the frequency of displacement cycles during stress testing;
   means for controlling a motor including means to regulate the amplitude of displacement of card fixturing during stress cycling according to the amplitude displacement setting and means to regulate the frequency of displacement cycles according to the setting of the frequency;
   means for detecting failures of electrical interconnection joints occuring between leads of components assembled to the card substrate and connection pads of a wiring layer of the card substrate;
   means for determining the locations of the detected failures and the approximate cycle count at which the detected failures occurred; and
   means for storing the locations of the failures and a cycle count at which such failures occurred in test failure distributions in a computer data base.

2. The system of claim 1 in which:
   the system further comprises: means for inputting a test temperature setting; and means for determining card assembly temperature;
   the means for determining when card assembly temperature equals the test temperature setting includes means for comparing the test temperature setting and the card assembly temperature;
   the system further comprises: means for inputting a test temperature tolerance; and means for determining if the card assembly temperature is outside of a test temperature range defined by the test temperature setting and the temperature tolerance;
   means for stopping the stress testing depending on the determination that the card assembly temperature is outside of the test temperature range;
   the system further comprises means for regulating the power supplied to a heater for regulating the test temperature;
   the system further comprises: means for inputting a termination displacement cycle count; means for stopping stress testing when the displacement cycle count reaches the termination displacement cycle count; and means for stopping heating and operation of a circulation fan when the displacement cycle count reaches the termination displacement cycle count;
   the system further comprises means for determining the distance between edge clamps holding a card assembly;
   the system further comprises means for adjusting the amplitude of displacement of the fixturing depending on the distance between edge clamps;
   the system further comprises means for selecting a dwell time; and
   the system further comprises means for storing a reference distribution of failures in a computer data base.

3. A circuit card assembly test machine, comprising:
   an insulated enclosure;
   a door of the enclosure opening for mounting the card assemblies in the enclosure for testing and for removing the card assemblies after testing;
   a heater within the enclosure for heating the card assemblies;
   automatic temperature regulation means to control the heater to maintain the card assemblies approximately at a testing temperature setting;
   fixturing means to hold card assemblies;
   motor means to apply a displacement for cyclicly stressing solder joints between a card substrate and components assembled to the card in response to stress control signals;
   a computer system including:
   means for maintaining a cycle count of displacement cycles during testing;
   user input means for selecting values and providing information;
   means for selecting maximum displacement setting for displacement cycles;
   means for selecting a cycle frequency setting for displacement cycles;
   stress control means to provide control signals to the motor means to control displacement cycles depending on the maximum displacement setting and cycle frequency setting;
   means for detecting failures of the solder joints and determining the card assembly locations of the failures;
   a computer data base; and
   means for recording a failure distribution for a respective card assembly including the locations of the failures and the cycle count of the failures, in the computer data base.

4. The system of claim 3 in which:

the computer system further includes means for receiving signals from a thermocouple attached to a card assembly;

the automatic temperature regulation means is included in the computer system and includes means for controlling heating depending on the signals received from the thermocouple attached to a card assembly;

the computer system further includes means for selecting the testing temperature setting;

the computer system further includes means for automatically initiating displacement cycles when the temperature of the card assemblies reaches the temperature setting;

the computer system further includes means to stop the heating when testing is terminated;

the computer system further includes means for selecting a testing temperature tolerance;

the computer system further includes means for automatically terminating stress testing if the temperature fluctuates outside of a selected temperature tolerance around the testing temperature setting;

the computer system further includes means for selecting a dwell time setting from 1 second to 10 minutes long;

the computer system further includes means for automatically pausing during each displacement cycle at each position of maximum displacement of the card for a dwell time depending on a dwell time setting;

the computer system further includes automatic means for determining and for recording the amplitude of a displacement applied to the card assembly during each displacement cycle;

the computer system further includes automatic means for determining and for recording the maximum twist applied to the card assembly during each displacement cycle;

the computer system further includes means for determining the distance between card assembly edge clamps of the fixturing;

the computer system further includes means to automatically adjust the cycling displacement depending on a distance between card assembly edge clamps of the fixturing means or between the opposite edges of the card assembly;

the computer system further includes user interface means for selecting the displacement, the displacement cycle frequency, or the termination cycle count, by an operator inputting values into a user interface;

the computer system further includes means for automatically testing a series of card assemblies using the same stored input of amplitude of displacement, displacement cycle frequency, or termination cycle count in order to reduce reentering of data for each card;

the computer system further includes means for inputting a termination cycle count and means for stopping the testing when the number of cycles reaches the termination cycle count;

the computer system further includes means for automatically detecting and recording failure data including the location and the approximate displacement cycle at which failures occur;

the means for automatically detecting and recording failure data including means to detect and record the exact cycle at which each recorded failure occurs;

the computer system further includes means to record failure data in a computer data base including location and displacement cycle of each recorded failure to build a test failure distribution;

the computer system further includes means to input information into the computer computer system to group failure data by component type, component location and joint location with respect to the respective component of the joint;

the computer system further includes means for storing a reference failure distribution derived from previous failure distributions of similar card assemblies produced in a similar process, in a computer data base;

the computer system further includes means for comparing the test failure data with the reference failure data;

the computer system further includes means for analyzing the comparison to determine the quality of the process used to manufacture the card assembly;

the means for comparing the test failure data with the reference failure data includes:

automatic means for calculating correlation factors based on the mean lives of a test failure distribution and mean lives of the reference distribution; and automatic means for normalizing the test failure distribution by multiplying the correlation factors times the mean lives of the test failure distribution; and the computer system further includes means for merging a test failure distribution and a reference failure distribution to build an improved reference failure distribution.

5. A device for generating digital signals for controlling a computer system of a stress test machine, comprising:

checking means for determining when card assemblies have reached testing temperature;

initiating means for automatically starting the stress testing depending upon reaching test temperature;

stress means for automatically controlling a maximum displacement cyclicly applied to a card assembly during testing;

data means for recieving data for a multitude of failures for a card;

count means for providing a displacement cycle count, associating means for relating the failure data to the displacement cycle count when receiving the failure data; and storing means for saving the failure data and related cycle count in a failure distribution for a respective card assembly in a computer data base for later access.

6. The device of claim 5 in which the device essentially consists of an optical disk which produces electromagnetic signals by reflectance as it spins in an electromagnetic field generated by a laser and which reflected electromagnetic signals are transduced to electrical signals by an electromagnetic detector in an optical disk drive of the test machine computer system, and including:

a flat disk to support optical switches pre-configured for providing the checking means, initiating means, stress means, data means, count means, associating means, and storing means, on a surface thereof; and a center hole through the disk for positioning the disk as it spins about the hole.

7. The device of claim 5 in which the device essentially consists of an magnetic type floppy disk which generates magnetic signals which can be transduced to electrical signals as the disk spins by a read or read/write head, and including:

a flat round disk to support preset magnetic switches for providing the checking means, initiating means, stress means, data means, count means, associating means, and storing means, on a surface thereof; and a center hole through the disk for positioning the disk as it spins about the hole.

8. The device of claim 5 in which the device essentially consists of a cartridge containing an electronic memory configured to provide the signals, and including:

one or more solid state memory switch mechanisms configured for providing the checking means, initiating means, stress means, data means, count means, associating means, and storing means, at least one connector for communication with a port of the stress tester;

a dielectric substrate for supporting the solid state memory mechanisms; and a wiring layer supported by the substrate electrically interconnecting the memory mechanisms and the connector.

9. The device of claim 5 in which the device essentially consists of another computer system for communicating with the computer system of the test machine through a computer network, and including:

one or more central processing units;

output means communicating with one or more of the central processing units, for communication with the computer system of the test machine through the computer network; and random access memory communicating with the central processing units and the output means and configured for providing the checking means, initiating means, stress means, data means, count means, associating means, and storing means.

10. The device of claim 5 in which:

the device further comprises means to input for selecting a testing temperature setting;

the device further comprises means to input for selecting temperature tolerances for the selected temperature setting;

the device further comprises means for determining that the testing temperature is out of tolerance;

the device further comprises means for automatically stopping the testing when the test temperature is out of the tolerance;

the device further comprises means to input for selecting a predetermined termination failure count;

the device further comprises means for automatically terminating the stress test depending the failure count reaching the termination failure count;

the device further comprises means to input for selecting a termination cycle count;

the device further comprises means for automatically terminating the stress test depending on the displacement cycle count reaching the termination cycle count;

the device further comprises means for determining and storing the amplitude of displacement for each displacement cycle;

the device further comprises means to input for identifying the process or technology for a failure distribution;

the device further comprises means for comparing failure distributions to identify anomalous differences;

the device further comprises means for generating a mean failure distribution from a multitude of stored failure distributions for respective card assemblies to form a base line or reference distribution of expected failures for a particular process and technology;

the device further comprises means for determining the reliability of first card assemblies made by a first process by comparing the failure distributions for the first card assemblies to failure distributions for similar second card assemblies made in a similar second process which were bridged to accelerated thermal cycling tests for the second card assemblies made by the second process;

the device further comprises means for bridging between mechanical stress cycling and accelerated thermal cycling tests including:

the means for receiving data for failures include means for receiving failure signals from a card as they occur during testing; and the storing means includes means for storing a plurality of failure distributions each for a respective card assembly.

11. Apparatus for testing circuit card assemblies, including:

means for producing card substrates with dielectric surfaces;

means for circuitizing the surfaces of the card substrates with connection pads and wiring conductors;

a screener for screening solder paste onto the circuitized substrates;

a pick and place machine for placing surface mount components onto the circuitized substrates;

a reflow oven for reflow soldering the solder paste to produce circuit card assemblies interconnected with solder metal joints;

a chamber for holding the card assemblies during stress testing;

means for maintaining the chamber at a preselected stable temperature during stress testing;

chamber openings for loading the card assemblies into the chamber and unloading the assemblies from the chamber;

fixturing means for holding the card assemblies during testing;

a motor to cyclicly displace the circuit card assemblies to provide displacement cycles to the solder joints;

means for automatically controlling the motor to provide predetermined displacement cycles with predetermined amplitudes of displacement;

means for determining a displacement cycle count; means for detecting failures in the joints of the card assembly; and means for automatically terminating the stress testing when a predetermined number of displacement cycles is reached.

12. The apparatus of claim 11, in which:

the fixturing means includes: a passive clamp for holding the first edge of a respective card assembly in a fixed position during testing; and an active clamp for moving a second edge on an opposite side of the card assembly from the first edge in predefined displacement cycles;

the center of the active clamp is mounted at the end of an axle which is supported only move rotationally about the axis of the axle to apply out of plane twisting along the center line of the card assembly during testing;

the motor means includes a stepper motor and gears transmission connected to another end of the axle opposite from the end connected to the active clamp to rotate the axle and clamp alternately clockwise and counter clockwise to twist an card assembly held between the active and passive clamps;

the means for detecting failures include means for connecting signal paths to the card assembly during stress testing;

the means for counting automatically counts the displacement cycles;

the means for detecting automatically detects failures during stress cycling; and the apparatus further comprises means for automatically recording the detected failures and displacement cycles at which the failures were detected, in a computer data base;

the means for recording includes means for determining the displacement cycle count and for recording a multitude of detected failures for each respective card assembly, and the cycle count at which each recorded failure occurred; and the means for automatically terminating stress testing includes means for terminating the testing if a predetermined maximum failure count setting is reached.

13. A process for continuously manufacturing high quality card assemblies, comprising the steps:

producing first circuit card assemblies by a first production process including:
  producing card substrates with dielectric surfaces;
  circuitizing card substrates including providing surface wiring layers with connection pads attached to wiring conductors;
  depositing solder in communication with terminals of components for the connection pads;
  placing components onto the card substrates with component terminals at the connection pads with the deposited solder in communication with terminals and pads;
  reflow heating the card substrates to form molten solder between the component terminals and connection pads; and
  cooling to form solid solder joints between the component terminals and connection pads to produce the first card assemblies;

selecting one or more of the first card assemblies for stress testing;

heating the selected assemblies to a preselected temperature for testing and maintaining the preselected temperature during stress testing;

exposing the solder joints of the selected card assemblies to predetermined displacement cycles until a multitude of solder joint failures are produced;

detecting the failures and determining the location of the failures;

counting the displacement cycles;

recording failure data for each detected failure including the location and cycle count at which the failure occured;

analysing the data including comparing the failure data to reference failure data and determining the quality of the manufacturing process depending on the comparison; and continuing to manufacture card assemblies by the process depending on the determination of process quality.

14. The method of claim 13 in which:

the step of producing card substrates includes impregnating fiberglass cloth with an epoxy;

the step of circuitizing includes forming holes through the card substrate; depositing copper in the holes to form conductive vias; and forming copper pads and wires connecting between the vias and pads on the surface of the substrate;

depositing solder includes screening a paste of metal particles and liquid carrier onto the pads on the circuitized substrate which paste forms molten solder when reflow heated;

the selection of card assemblies includes, selecting one or more identical test vehicles that are different than normal production card assemblies and are passed through a production line for production card assemblies, the test vehicles having similar components in mirror image positions with respect to a major axis of the test vehicles and connector means for detecting failures during test stressing;

a sufficient number of first card assemblies are tested to produce a distribution of failures of a plurality of components to determine a means fatigue life and standard deviation within 10% of actual values with a 95% confidence level;

mounting the card assemblies includes, connecting a passive clamp which does not move during testing to one end of respective card assemblies and connecting an active clamp that moves during testing to an opposite edge of respective card assemblies;

the card assemblies are subject to the displacement cycles until a multitude of electrical connections between components mounted on the card assembly and wiring patterns in the card assembly have failed;

cyclicly stressing solder joints includes rotating active clamps connected to one end of respective card assemblies to twist the circuit board out of plane along a central longitudinal axis of the circuit board;

the reference failure data are the combined results of at least one previous, similar, second stress test using similar, second card assemblies produced earlier using a similar, second production process;

the second production processes is performed at an earlier time on the same production line as the first assembly process;

the first and second production processes share one or more process variables;

the method further comprising intentionally using a different value for one of the process variables shared by the first and second production processes;

the value of at least one of the shared process variables is different for the first and second production processes, and the value of the variable used for subsequent production of card assemblies depends on the determined differences in quality of the two production processes;

the testing is performed periodically and sufficiently often to maintain the quality of card assemblies produced on the production line;

the frequency of testing is selected to maintain a preselected statistical level of quality;

the results of testing are stored as respective failure distributions in a computer data base;

the method further comprising exposing one or more card assemblies produced in an at least similar production process, to accelerated thermal cycling fatigue tests sufficient to provide a distribution of failures sufficient to produce statisticly valad reliability data for the test card and to bridge between mechanical stress data and thermal cycling stress data;

the method further comprises the preliminary step of determining an amplitude of displacement and the frequency of cycling, that minimizes time on test while producing the same failure mechanisms as accelerated thermal cycling;

the method further comprises the preliminary step of determining a minimum dwell time that minimizes time on test while producing the same failure mechanisms as accelerated thermal cycling;

multiple card assemblies of the first process are tested to produce statistically valid fatigue data for comparison to the reference failure data;

analysing the data includes the steps of:
grouping joint failure data primarily by component type and secondarily by location of the component on the card assembly and thirdly by joint location on the respective component;
merging failure data for joints of components in positions that are symetrical with respect the the central longitudinal axis or central lateral axis or opposite sides of the card assemblies are merged to provide larger test failure distributions for such locations;
selecting a reference failure distribution for one of the joints with a mean fatigue life between the mean fatigue lives of other distributions; and
normalizing the failure distribution for each group the method further comprises merging the test failure distribution into the reference failure distribution for each merged failure location;

the amplitude of displacement during each cycle is constant within 1%; and during testing the resistance of joints is constantly monitored so that any increase in resistance is immediately detected as a failure.

15. The method of claim 13 in which:
the method further comprises the preliminary step of determining the displacement and the frequency of cycling that minimizes time of test while producing the same failure mechanisms as field failures;
the method further comprises the preliminary step of determining a minimum dwell time that minimizes time on test while producing the same failure mechanisms as field failures; and
the displacement cycles include periodic pauses at small fractions of the total number of cycles, during which failures are detected.

16. A method for continuously producing high quality card assemblies, comprising the steps:
producing card assemblies in a first manufacturing process including:
producing card substrates with a dielectric surfaces;
circuitizing the card substrates including providing a surface wiring layers with connection pads attached to conductors;
depositing solder in communication with terminals of components for the connection pads;
placing components onto the card substrates with component terminals at the connection pads with the deposited solder in communication with terminals and pads;
reflow heating the card substrates to form molten solder between the component terminals and connection pads; and
cooling to form solid solder joints between the component terminals and connection pads to produce the first card assemblies;

selecting one or more first card assemblies which have been produced by the first manufacturing process;

heating the first card assemblies to a stable testing temperature and maintaining the temperature during testing;

mounting the first card assemblies in fixturing;

cyclicly stressing solder joints between pads of wiring layers on card substrates and leads of components attached to the card substrates, of the first card assemblies;

counting the stressing cycles for the first card assemblies;

determining the locations of failures of the joints during cycling;

recording failure distributions including the locations of failures and the corresponding cycle counts for the failures;

testing a second manufacturing process by performing the steps of:
producing second card assemblies with approximately the same structure as the first card assemblies in a second manufacturing process which is similar to the first manufacturing process and including:
producing card substrates with a dielectric surfaces;
circuitizing card substrates including providing a surface wiring layers with connection pads attached to conductors;
depositing solder in communication with terminals of components for the connection pads;
placing components onto the card substrates with component terminals at the connection pads with the deposited solder in communication with terminals and pads;
reflow heating the card substrates to form molten solder between the component terminals and connection pads; and
cooling to form solid solder joints between the component terminals and connection pads to produce the first card assemblies;

selecting one or more second card assemblies with approximatly the same structure as the first card assemblies and which have been produced by a second manufacturing process;

heating the second card assemblies to a stable testing temperature and maintaining the temperature during testing;

mounting the second card assemblies in fixturing;

cyclicly stressing solder joints between pads of wiring layers on substrates and leads of components attached to the second card assemblies;

counting the stressing cycles for the second card assemblies;

detecting the locations of failures of the joints of the second card assemblies;

recording a failure distribution for the second card assemblies including the locations of failures and the corresponding cycle counts for the failures;

analyzing the failure data including comparing the locations of failures and cycle counts for the first card assemblies with the locations of failures and cycle counts for the second card assemblies to identify differences in the quality of the manufacturing processes; and manufacturing card assemblies depending on results of the analysis.

17. The method of claim 16 in which:

the method further comprises adjusting process variables depending on the differences in quality of production; and the testing is repeated at sufficient intervals to maintain the quality of the production process.

18. A method for manufacturing card assemblies in an optimized process, comprising the steps:

producing card assemblies by a manufacturing process with one or more controllable parameters at a first setting, including:
producing card substrates with dielectric surfaces;
circuitizing the card substrates including providing a surface wiring layers with connection pads attached to conductors;
depositing solder in communication with terminals of components for the connection pads;
placing components onto the card substrates with component terminals at the connection pads with the deposited solder in communication with terminals and pads;
reflow heating the card substrates to form molten solder between the component terminals and connection pads; and
cooling to form solid solder joints between the component terminals and connection pads to produce the first card assemblies;

selecting one or more first card assemblies produced in the manufacturing process;

heating the first card assemblies to a predetermined temperature for testing and maintaining a stable temperature during testing;

exposing the first card assemblies to a set of displacement cycles until a population of multiple failures of card assembly elements have occurred;

detecting and recording failure data for the first card assemblies;

producing card assemblies by the manufacturing process with one or more of the controllable parameters at a second setting different than the first setting;

selecting one or more second card assemblies produced by the manufacturing process after such change of parameters;

detecting and recording failure data for the second card assemblies;

comparing the failure data for the population of failures for the second card assemblies to reference failure data including the population of failures of the first card assemblies; and determining whether the quality of the manufacturing process has improved, degraded or remained unchanged due to the difference in the process parameters depending on the comparison; and manufacturing card assemblies with the parameters set depending on the determination of quality.

19. A method of operating a signal generating device for manufacturing card assemblies, comprising:

establishing digital communication between the signal generating device and a mechanical stress tester;

generating signals to provide means for automatically initiating testing in response to signal that a stable testing temperature has at least approximately been reached;

generating signals to provide means for automatically controlling a displacement cyclicly applied to a circuit card during testing;

generating signals to provide means for automatically determining the cycle count during displacement;

generating signals to provide means for determining failure location and related failure count for a multitude of failure signals recieved for a card assembly; and generating signals to provide means for storing the failure data and related cycle counts in a computer data base.

20. The method of claim 19 in which:

the method further comprises generating signals to provide means for automatically stopping testing if a testing temperature fluctuates outside of a selected tolerance;

the method further comprises generating signals to provide means for storing a predetermined termination failure count;

the method further comprises generating signals to provide means for automatically terminating the test depending on the termination failure count and the number of failures that have been received;

the method further comprises generating signals to provide means for storing a predetermined termination cycle count;

the method further comprises generating signals to provide means for automatically terminating the test depending on the termination cycle count and the number of cycles that have been counted;

the method further comprises generating signals to provide means for determining the maximum angle of twist for each displacement cycle and storing data related to the maximum angle of twist;

the method further comprises generating signals to provide means for identifying the process or technology for a failure distribution;

the method further comprises generating signals to provide means for comparing failure distributions to identify anomalous differences;

the method further comprises generating signals to provide means for automatically determining the amplitude of angle of twist for a card depending on input card length, thickness, and technology;

the method further comprises generating signals to provide means for generating an average failure distribution from a multitude of stored distributions for card assemblies to form base-line or reference distributions of expected failures for a particular process and technology;

the method further comprises generating signals to provide means for determining the reliability of card assemblies made by a process by normalizing a distribution of fails for the card depending on a generated base-line distribution;

receiving data for failures includes receiving failure signals from a card as they occur during testing;

receiving data for failures includes receiving locations for failures, and relating includes relating the failure location to the number of cycles to produce a distribution for failures by location and cycle, and the step of storing the distribution includes storing the distribution with failure locations related to failure cycles; and the step of storing includes storing failure distributions for a plurality of card assemblies.

21. A method of producing a quality computer system, comprising:

producing card assemblies in a manufacturing process with controllable parameters related to assembly quality, including:
producing card substrates with dielectric surfaces;
circuitizing card substrates including providing surface wiring layers with connection pads attached to wiring conductors;
depositing solder in communication with terminals of components for the connection pads;
placing components onto the card substrates with component terminals at the connection pads with the deposited solder in communication with terminals and pads;
reflow heating the card substrates to form molten solder between the component terminals and connection pads; and
cooling to form solid solder joints between the component terminals and connection pads to produce the first card assemblies;
selecting one or more of the card assemblies;
heating the card assemblies up to a selected test temperature;
maintaining a stable test temperature;
stressing the selected card assemblies until multiple failures have occurred;
detecting failures of joints between component terminals and the card substrate;
determining the location of the failures and a cycle count in which the failures are detected;
recording the location and cycle counts in a computer data base;
comparing the locations and cycle counts of the failures with location and cycle counts in a reference data base of failures of previous tests to determine quality;
controlling the parameters depending on the determined quality while producing additional card assemblies; and
connecting one or more of the card assemblies in a system with a CPU, ROM, RAM, input means, power supply, and video display output means to produce the quality computer system.

22. A method for producing high reliability computer systems, comprising:

producing multiple circuit card assemblies in an assembly process, including:
producing card substrates with dielectric surfaces;
circuitizing card substrates including providing surface wiring layers with connection pads attached to wiring conductors;
depositing solder in communication with terminals of components for the connection pads;
placing components onto the card substrates with component terminals at the connection pads with the deposited solder in communication with terminals and pads;
reflow heating the card substrates to form molten solder between the component terminals and connection pads; and
cooling to form solid solder joints between the component terminals and connection pads to produce the first card assemblies;

loading multiple card assemblies into fixturing of a stress tester;
heating the card assemblies above ambiant conditions to a selected temperature;
maintaining the temperature essentially constant during testing;
cyclicly displacing the card assemblies to cause stress in the solder joints sufficiently to only cause failures in low reliability card assemblies;
detecting solder joint failures to determine which card assemblies have high reliability;
unloading the card assemblies from the stress tester; and
connecting the high reliability card assemblies into computer systems to provide a high reliability computer systems.

23. The method of claim 22 in which:

the displacement is out of plane twisting about the central longitudnal axis of the card assemblies;
the card assemblies are stressed for 10 to 1000 cycles;
the displacement cycle frequency is above 0.1 cycles per second;
the temperature of the card assemblies is above ambiant when tested;
the temperature of the card assemblies is above 100° C. when tested;
the card assemblies are tested at a temperature above the normal operating temperature of the card assemblies;
the fixturing includes a clamp at one edge and another clamp at another opposite edge of each respective card assembly;
during loading the card assemblies are slid into the clamps from the ends of the clamps and during unloading, the card
assemblies are slid out of the clamps in the same direction that the card assemblies are slid into the clamps;
the card assemblies are continuously monitored for any changes in resistance while being twisted to stress the cards;
the method further comprises the step of selecting a dwell time;
the method further comprises the steps of pausing each cycle at maximum displacements of the circuit board for the selected dwell time of 1 to 120 seconds;
the method further comprises the step of adjusting the fixturing to accommodate specific size of card assemblies tested;
the method further comprises the step of automatically adjusting the displacement depending on the distance between card assembly edge clamps of the fixturing means or between the opposite edges of the card assembly;
the method further comprises the step of testing a series of card assemblies using the same stored selections of displacement amplitude, cycle frequency, or termination cycle count, to reduce reentering of data for each card test;
the fixturing holds two opposite edges of a card assembly in the enclosure, along essentially the entire length of each such edge; and
during stress cycling the fixturing twists the card assembly out of plane in two directions to induce cyclic shear and axial deformation in the joints of the card assembly.

* * * * *